(12) United States Patent
Koyanagi

(10) Patent No.: US 8,593,313 B2
(45) Date of Patent: Nov. 26, 2013

(54) PARALLEL-TO-SERIAL CONVERSION CIRCUIT, INFORMATION PROCESSING APPARATUS, INFORMATION PROCESSING SYSTEM, AND PARALLEL-TO-SERIAL CONVERSION METHOD

(75) Inventor: Yoichi Koyanagi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/476,287

(22) Filed: May 21, 2012

(65) Prior Publication Data
US 2012/0313799 A1    Dec. 13, 2012

(30) Foreign Application Priority Data
Jun. 8, 2011  (JP) ................................ 2011-128408

(51) Int. Cl.
*H03M 9/00* (2006.01)

(52) U.S. Cl.
USPC .......................................... 341/101; 341/100

(58) Field of Classification Search
USPC ................................................. 341/100, 101
See application file for complete search history.

(56) References Cited

U.S. PATENT DOCUMENTS

| 5,726,990 | A | * | 3/1998 | Shimada et al. | ............... | 370/536 |
| 6,741,193 | B2 | * | 5/2004 | Nagata | ......................... | 341/101 |
| 7,369,069 | B2 | * | 5/2008 | Usugi et al. | .................... | 341/100 |
| 7,525,458 | B2 | * | 4/2009 | Morzano et al. | ............... | 341/100 |
| 7,890,679 | B2 | * | 2/2011 | Fujisawa | ......................... | 710/66 |
| 8,102,288 | B2 | * | 1/2012 | Koyanagi | ....................... | 341/101 |
| 8,289,196 | B2 | * | 10/2012 | Tsunoda | ........................ | 341/101 |
| 2002/0075173 | A1 | | 6/2002 | Nagata | | |
| 2004/0150539 | A1 | * | 8/2004 | Okajima | ........................ | 341/100 |
| 2010/0149137 | A1 | * | 6/2010 | Saito | .............................. | 345/204 |
| 2010/0328118 | A1 | * | 12/2010 | Koyanagi | ....................... | 341/101 |
| 2011/0243565 | A1 | * | 10/2011 | Wolf | .............................. | 398/115 |
| 2012/0007755 | A1 | * | 1/2012 | Kashiwakura | ................ | 341/101 |

FOREIGN PATENT DOCUMENTS

| JP | 9-55667 | 2/1997 |
| JP | 2002-152053 | 5/2002 |

* cited by examiner

*Primary Examiner* — Linh Nguyen
(74) *Attorney, Agent, or Firm* — Staas & Halsey LLP

(57) ABSTRACT

A parallel-to-serial conversion circuit includes a plurality of parallel-to-serial conversion units, each being configured to include a dividing circuit configured to divide a clock signal having a second clock cycle to generate a clock signal having a first clock cycle, a parallel input circuit configured to input a signal having a plurality of bits parallel to one another in the first clock cycle, and a serial output circuit configured to serially output the signal having the plurality of bits input to the parallel input circuit bit-by-bit in the second clock cycle, wherein, among the plurality of parallel-to-serial conversion units, one of the dividing circuits has a synchronization signal interface that causes an output clock signal to synchronize with a clock signal output from the other dividing circuit in another parallel-to-serial conversion unit.

6 Claims, 9 Drawing Sheets

PARALLEL-TO-SERIAL CONVERSION CIRCUIT, INFORMATION PROCESSING APPARATUS, INFORMATION PROCESSING SYSTEM, AND PARALLEL-TO-SERIAL CONVERSION METHOD

CROSS-REFERENCE TO RELATED APPLICATION

This application is based upon and claims the benefit of priority of the prior Japanese Patent Application No. 2011-128408, filed on Jun. 8, 2011, the entire contents of which are incorporated herein by reference.

FIELD

The embodiments discussed herein are related to a parallel-to-serial conversion circuit, and an information processing apparatus and an information processing system including the parallel-to-serial conversion circuit.

BACKGROUND

Parallel-to-serial data transmission is known in which parallel data including a plurality of bits (for example, 16 bits) is converted into single-bit serial data synchronized with a certain clock (CLK) signal and output.

In recent years, in data transfer between computer devices or the like, a technique has been proposed in which parallel-to-serial conversion circuits are provided for a plurality of channels (lanes). In this technique, data transmission is executed while high-speed serial data transmission lanes, which are the outputs of the channels, are arranged parallel to one another as a group. By executing the data transmission using the high-speed serial data transmission lanes arranged parallel to one another as a group, the transmission capacity and the transmission speed relating to the data transfer are improved, thereby improving the transmission efficiency in the data transmission.

When the data transmission is executed using the plurality of high-speed serial data transmission lanes arranged parallel to one another as a group, skew in output data that occurs between the lanes poses a problem. In order to describe this problem, diagrams illustrating data skew that occurs between the lanes are provided in FIGS. 7 and 8.

FIG. 7 is a schematic block diagram illustrating a transmission path provided with parallel-to-serial conversion circuits (P/S conversion circuits 100) in a plurality of lanes (in FIG. 7, three lanes). For example, pieces of 8-bit parallel data (PD0 to PD2) are input to the P/S conversion circuits 100 in the lanes, respectively. Pieces of serial data after P/S conversion, which are the outputs of the lanes, are single-bit data strings obtained by adjusting the pieces of input 8-bit parallel data using a CLK signal. The pieces of serial data (SD0 to SD2), which are the outputs of the lanes, change at unit intervals defined by the CLK cycle and are output in synchronization with the CLK cycle. As illustrated in FIG. 7, when the transmission path includes a plurality of lanes, the pieces of data (SD0 to SD2) to be output may be synchronized with one another by inputting the same CLK signals to the plurality of lanes.

However, even if the synchronization between the lanes is realized by using the same CLK signals, differences in timing or the like are caused between the outputs of the lanes because of differences in wiring capacity and differences in processing of delay between the plurality of P/S conversion circuits. As a result, skew, which is differences in timing, undesirably occurs between serial data strings, which are intended to be output in synchronized with one another. In data transmission using the plurality of lanes between which skew has occurred, an error may be caused. FIG. 8 is a timing chart illustrating a state in which skew has occurred between the plurality of lanes of output data.

The P/S conversion circuits 100 in Lanes 0 to 2 receive the pieces of 8-bit parallel data (PD0 to PD2), respectively, synchronized with one another. The piece of parallel data PD0 is input to Lane 0. The piece of parallel data PD1 is input to Lane 1. The piece of parallel data PD2 is input to Lane 2. The piece of parallel data PD0 has data strings A0, B0, and C0, each having a bit value that changes between 0 and 1 in a certain cycle. The piece of parallel data PD1 has data strings A1, B1, and C1 whose bit values change in the same timing as those of the piece of parallel data PD0. The piece of parallel data PD2 has data strings A2, B2, and C2 whose bit values change in the same timing as those of the pieces of parallel data PD0 and PD1.

The piece of parallel data PD0 has the data strings in which 8-bit data blocks [A00 to A07], [B00 to B07], and [C00 to C07] are sequentially arranged. The piece of parallel data PD1 has the data strings in which 8-bit data blocks [A10 to A17], [B10 to B17], and [C10 to C17] are sequentially arranged. The piece of parallel data PD2 has the data strings in which 8-bit data blocks [A20 to A27], [B20 to B27], and [C20 to C27] are sequentially arranged. In the configuration of the data blocks, for example, "A07" indicates a high-order bit and "A00" indicates a low-order bit.

Since the same CLK signals are supplied to the lanes, the pieces of serial data (SD0 to SD2), which are output in synchronization with the CLK signals, are synchronized with one another between the lanes. For example, when the bit value of the piece of serial data SD0 in Lane 0 is [A00], bit values of [A10] and [A20] are output from Lanes 1 and 2, respectively. This holds true for the data strings B0, B1, and B2, and the data strings C0, C1, and C2. That is, the bit values [B00, B10, and B20] and the bit values [C00, C10, and C20] are sequentially output in this order.

However, if skew occurs between the lanes, the output values that have been synchronized with one another between the serial data strings (SD0 to SD2), which are the outputs of the lanes, respectively, deviate from one another. For example, the bit values that would otherwise be arranged as [A07, A17, and A27] between the lanes and output may be output while deviating from one another as illustrated in FIG. 8. As illustrated in FIG. 8, the bit values of the lanes between which the skew has occurred may become, for example, [A07, A10, and A26], deviating from one another between the lanes. As a result, when data transmission is executed while arranging the serial data outputs of the plurality of lanes parallel to one another as a group as illustrated in FIG. 7, an incorrect piece of data may be transmitted.

The following is reference documents:
[Document 1] Japanese Laid-open Patent Publication No. 9-55667
[Document 2] Japanese Laid-open Patent Publication No. 2002-152053.

SUMMARY

According to an aspect of the embodiment, a parallel-to-serial conversion circuit includes: a plurality of parallel-to-serial conversion units, each being configured to include a dividing circuit configured to divide a clock signal having a second clock cycle to generate a clock signal having a first clock cycle, a parallel input circuit configured to input a signal having a plurality of bits parallel to one another in the first clock cycle, and a serial output circuit configured to serially output the signal having the plurality of bits input to the parallel input circuit bit-by-bit in the second clock cycle, wherein, among the plurality of parallel-to-serial conversion units, one of the dividing circuits has a synchronization signal interface that causes an output clock signal to synchronize with a clock signal output from the other dividing circuit in another parallel-to-serial conversion unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present disclosure will be described hereinafter with reference to the drawings. The configurations of the following embodiments are examples, and the present disclosure is not limited to these embodiments. First, before describing the embodiments of the present disclosure, a parallel-to-serial conversion circuit according to a comparison example will be described.

Comparison Example

Figure 9:
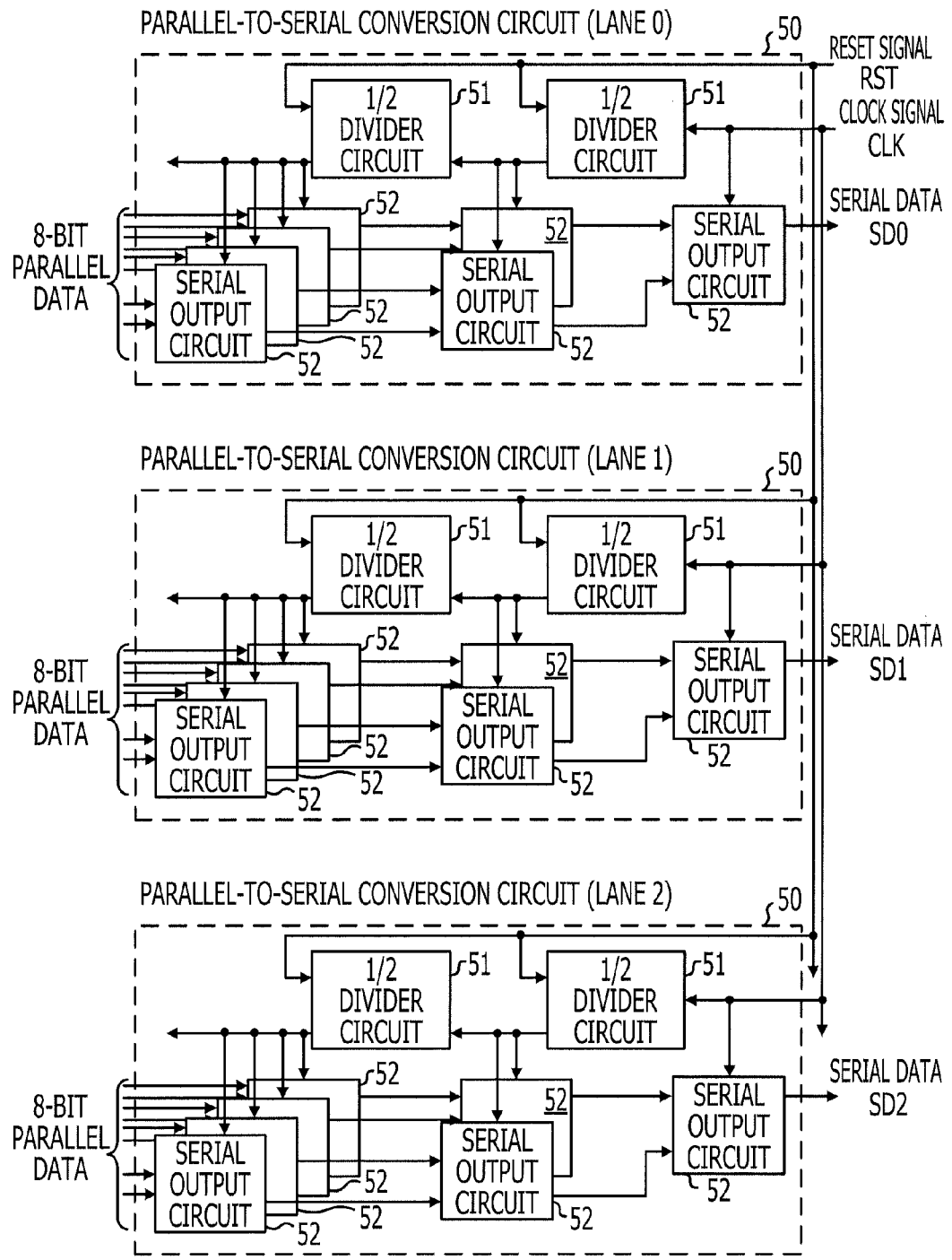
FIG. 9 is a schematic block diagram illustrating parallel-to-serial conversion circuits in which reset signals are used to synchronize data transmission lanes that output serial data with one another.

FIG. 9 is a schematic block diagram illustrating parallel-to-serial conversion circuits 50 according to the comparison example. This parallel-to-serial conversion circuits 50 uses reset (RST) signals to synchronize data transmission lanes that output serial data strings. In the comparison example illustrated in FIG. 9, the parallel-to-serial conversion circuits 50 are provided for three channels (lanes). The parallel-to-serial conversion circuits 50, for example, convert 8-bit parallel data into single-bit serial data and output the single-bit serial data. The same clock signal CLK is supplied to each lane. The outputs of the lanes after parallel-to-serial conversion are pieces of serial data SD0 to SD2, respectively. Each piece of the serial data changes at unit intervals defined by the CLK cycle, and is output in synchronization with the clock signal. The same reset signal RST is supplied to each lane.

The parallel-to-serial conversion circuits 50 in the lanes synchronize the output timing of the pieces of serial data, which are the outputs of the lanes, using the reset signals RST.

The parallel-to-serial conversion circuits 50 illustrated in FIG. 9 convert the 8-bit parallel data into the single-bit serial data and output the single-bit serial data. Therefore, each parallel-to-serial conversion circuit 50 includes three-stage multiplexer units, namely an initial stage multiplexer unit, an intermediate stage multiplexer unit, and a final stage multiplexer unit. Each multiplexer unit includes a certain number of serial output circuits 52, each having a "two-input, one-output" multiplexer (MUX). Each serial output circuit 52 converts two pieces of data input parallel to each other into single-bit serial data by adjusting the two pieces of data using a clock signal, and outputs the single-bit serial data. The output of each serial output circuit 52 is synchronized with the clock signal.

In each parallel-to-serial conversion circuit 50, for example, 8-bit parallel data is converted into four pieces (four lines) of serial data that are parallel to one another through the initial stage multiplexer unit and then output to the intermediate stage multiplexer unit. The four lines of serial data are converted into two lines of serial data that are parallel to each other through the intermediate stage multiplexer unit and then output to the final stage multiplexer unit. The two lines of serial data that are parallel to each other output from the intermediate stage multiplexer unit are adjusted by the final stage multiplexer unit and converted into one line of serial data, and then output. The output of the final stage multiplexer unit is the serial data output from the corresponding lane.

Each parallel-to-serial conversion circuit 50 has first and second ½ divider circuits 51. The first ½ divider circuit 51 divides the original frequency of the same clock signal CLK supplied to each lane in half. The second ½ divider circuit 51 further divides the clock signal divided by the first ½ divider circuit 51, that is, divides the original frequency of the clock signal CLK into quarters. The first and second ½ divider circuits 51 receive the same reset signal RST supplied to each lane.

The initial stage multiplexer unit has four serial output circuits 52, which convert pieces of 8-bit data input parallel to one another into four lines of serial data and output the four lines of serial data to the intermediate stage multiplexer unit. The intermediate stage multiplexer unit has two serial output circuits 52, which adjust the four lines of serial data input parallel to one another and convert the four lines of serial data into two lines of serial data, and then output the two lines of serial data to the final stage multiplexer unit. The final stage multiplexer unit is a single serial output circuit 52, which adjusts the two lines of serial data input parallel to each other and outputs serial data in which the pieces of 8-bit data input parallel to one another are arranged in a line. The output of the serial output circuit 52 in the final stage is the serial data converted by the corresponding lane.

The clock signal CLK supplied to each parallel-to-serial conversion circuit 50 is divided in each parallel-to-serial conversion circuit 50. One half of the clock signal CLK is input to the final stage multiplexer unit. Another half of the clock signal CLK is input to the first ½ divider circuit 51. The clock signal CLK input to the first ½ divider circuit 51 is divided and obtains half the original frequency. The clock signal having half the original frequency is further divided. The divided clock signal having half the original frequency is input to the second ½ divider circuit 51 and the intermediate stage multiplexer unit. The clock signal having half the original frequency input to the second ½ divider circuit 51 is further divided in half, and obtains a quarter of the original frequency. The clock signal having a quarter of the original frequency is input to the initial stage multiplexer unit.

The clock signal that has obtained a quarter of the original frequency by passing through the first and second ½ divider circuits 51 is supplied to each of the four serial output circuits 52 included in the initial stage multiplexer unit. 8-bit parallel data is adjusted in synchronization with the clock signal having a quarter of the original frequency. In the initial stage multiplexer unit, pieces of serial data in each serial output circuit 52 are arranged in a line in synchronization with the clock signal having a quarter of the original frequency and input to the intermediate stage multiplexer unit. That is, the four lines of serial data, which are the outputs of the initial stage multiplexer unit, are synchronized with the clock signals having a quarter of the original frequency between the lines.

Next, the clock signal that has obtained half the original frequency by passing through the first ½ divider circuit 51 is supplied to each of the two serial output circuits 52 included in the intermediate stage multiplexer unit. The four lines or serial data arranged in lines by the clock signals having a quarter of the original frequency are synchronized with the clock signals having half the original frequency and adjusted. Serial data in the serial output circuits 52 in the intermediate stage multiplexer unit is synchronized with the clock signals having half the original frequency and arranged in lines, and then input to the final stage multiplexer unit. That is, the two lines of serial data output from the intermediate stage multiplexer unit are synchronized with the clock signals having half the original frequency between the lines.

The clock signal CLK supplied to each parallel-to-serial conversion circuit 50 has the frequency of a signal that has not been divided, that is, for example, the original frequency of a clock signal generation circuit, which is not illustrated, and is supplied to the final stage multiplexer unit. In the intermediate stage multiplexer unit, the two lines of serial data arranged in lines by the clock signals having half the original frequency are synchronized with the clock signal CLK having the original frequency and adjusted in the final stage multiplexer unit. Serial data in the serial output circuit 52 included in the final stage multiplexer unit is the serial data output from the corresponding lane. That is, the pieces of serial data SD0 to SD2 synchronized with the clock signals CLK having the original frequency supplied to the lanes are synchronized with one another between the lanes.

As described above, the three-stage multiplexer units included in each parallel-to-serial conversion circuit 50 operate in synchronization with the clock signal CLK. The pieces of serial data SD0 to SD2 output from the lanes are bit strings output in synchronization with the clock signals CLK. Therefore, if skew occurs between the outputs of the lanes, the plurality of ½ divider circuits 51 included in each lane are reset using the reset signals RST that change at the same timing between the lanes. As a result, each parallel-to-serial conversion circuit 50 is synchronized with the clock signal CLK again and restored to a state in which data may be output.

Upon detecting a change in the status of the reset signal RST, each ½ divider circuit 51 that has been reset determines an output status value to a reset status. Each ½ divider circuit 51 after the reset is then synchronized with a first clock signal input thereto and begins a certain dividing operation. That is, the plurality of ½ divider circuits 51 included in each lane after the reset operate in synchronization with the first clock signal that has been input thereto, and therefore synchronization is established again between the lanes.

Skew may occur between the lanes when, for example, the power of an information processing apparatus including such parallel-to-serial conversion circuits 50 is turned on. Because the initial state of each ½ divider circuit 51 in each parallel-to-serial conversion circuit 50 has not been determined in an initial operation immediately after the power is turned on, an output value is not specified. Therefore, the plurality of serial output circuits 52 to which the clock signals are supplied from the ½ divider circuits 51 might not determine when to execute a process for adjusting input data. For this reason, in an information processing apparatus including the plurality of parallel-to-serial conversion circuits 50, skew occurs between the lanes.

In order to reduce the skew between the lanes, the parallel-to-serial conversion circuits 50 according to the comparison example change the status of the reset signals RST after the skew occurs between the lanes. Upon detecting the change in the status of the reset signal RST, each parallel-to-serial conversion circuit 50 determines the output values of the ½ divider circuits 51 to be reset values. All the ½ divider circuits 51 enter the reset state at the same time and obtain a predetermined reset status value. Thereafter, the first ½ divider circuit 51 is synchronized with a first clock signal CLK input thereto and outputs a clock signal that has been divided in half. The second ½ divider circuit 51, too, is synchronized with a first clock signal input thereto that has been divided in half and outputs a clock signal divided into quarters.

A plurality of pieces of parallel data (8 bits×3 lanes) are input, in synchronization with one another, to the three parallel-to-serial conversion circuits 50 arranged parallel to one another. Each piece of parallel data is input to the initial stage multiplexer unit included in each lane. The pieces of parallel data are input to the four serial output circuits 52 included in the initial stage multiplexer unit in parallel to one another. The pieces of parallel data input to the serial output circuits 52 are synchronized with one another between the lanes. The clock signal having a quarter of the original frequency synchronized with the clock signal CLK having the original frequency is input to each serial output circuit 52. The clock signals having a quarter of the original frequency after the reset change in synchronization with one another between the three lanes. That is, the four lines of serial data that have been adjusted in synchronization with the clock signals having a quarter of the original frequency are synchronized with one another between the three lanes.

The 4 lines×3 lanes serial data outputs of the lanes are input to the respective intermediate stage multiplexer units in the lanes. The 4 lines×3 lanes serial data outputs have been adjusted in synchronization with the clock signals having a quarter of the original frequency in the initial stage multiplexer unit. The plurality of serial output circuits 52 included in the intermediate stage multiplexer unit receive the clock signals having half the original frequency synchronized with the clock signal CLK having the original frequency. The clock signals having half the original frequency after the reset change in synchronization with one another between the three lanes. That is, the two lines of serial data to be output that have been adjusted in synchronization with the clock signals having half the original frequency are synchronized with each other between the three lanes.

The 2 lines×3 lanes serial data outputs of the lanes are input to the respective final stage multiplexer units in the lanes. The 2 lines×3 lanes serial data outputs have been adjusted in synchronization with the clock signals having half the original frequency in the intermediate stage multiplexer unit. The single serial output circuit 52 included in the final stage multiplexer unit receives the clock signal CLK having the original frequency supplied to each of the three lanes. The clock signals CLK that are the same between the three lanes change in synchronization with one another between the three lanes. The serial data outputs adjusted in synchronization with the same clock signals CLK are synchronized with one another between the three lanes and output. That is, the pieces of 8-bit parallel data that have been input in synchronization with one another to the three parallel-to-serial conversion circuits 50 arranged parallel to one another are output as serial data synchronized with the clock signals CLK that are the same between the lanes.

Thus, by using the same reset signals, skew between the lanes may be reduced. After the reset is executed, pieces of serial data that have been newly synchronized with one another between the lanes are output. However, there is still a problem in that the same reset signals distributed to all the ½ divider circuits 51 included in the plurality of lanes do not change at a synchronized timing. In order to solve this problem, the parallel-to-serial conversion circuits 50 according to the comparison example each include, for example, a distribution circuit or the like having a function of adjusting a delay caused between the lanes. A parallel-to-serial conversion circuit 50 having such a distribution circuit or the like may lead to increases in the complexity of the circuit, the number of components, the area of the circuit, the total cost, and the like.

In addition, according to high-speed serial interface standards according to which such a method for transmitting data is adopted, adjustment of a delay caused between the lanes is difficult because the frequency of a clock signal adopted for parallel-to-serial conversion is high. For example, backplane communication, which is a connection between boards inside a device, is adopted in accordance with The Institute of Electrical and Electronics Engineers, Inc. (IEEE) 802.3ap 10 GBASE-KR, which is an example of such standards. The standards also include data transmission standards that connect a processor and a peripheral device by a high-speed serial interface, such as Peripheral Component Interconnect (PCI) Express, Fibre Channel, and InfiniBand (registered trademark).

In the case of PCI Express, for example, a transmission speed of 2.5 Gbps/lane is used. Therefore, the unit interval (UI) of data for a single bit is 400 ps. In the parallel-to-serial conversion circuits 50 according to the comparison example, a delay caused between the lanes is adjusted during this unit interval of data in order to reduce skew between the lanes using the same reset signals. The adjustment of a delay caused between the lanes is executed for all the ½ divider circuits 51 included in the plurality of lanes. Furthermore, adjustment of a delay relative to the reset signal is executed in the parallel-to-serial conversion circuit 50 in each lane and the timings at which the reset signals are input to all the ½ divider circuits 51 included in the parallel-to-serial conversion circuits 50 are synchronized with one another.

In parallel-to-serial conversion circuits according to the embodiments, even if one of the above-described high-speed serial interface standards is used, it is possible to arrange data outputs of a plurality of lanes within 1 UI and output the data outputs. In addition, a complex circuit for synchronizing the lanes is not included. The parallel-to-serial conversion circuits according to the embodiments will be described hereinafter.

Parallel-to-Serial Conversion Circuit

First Embodiment

Figure 1:
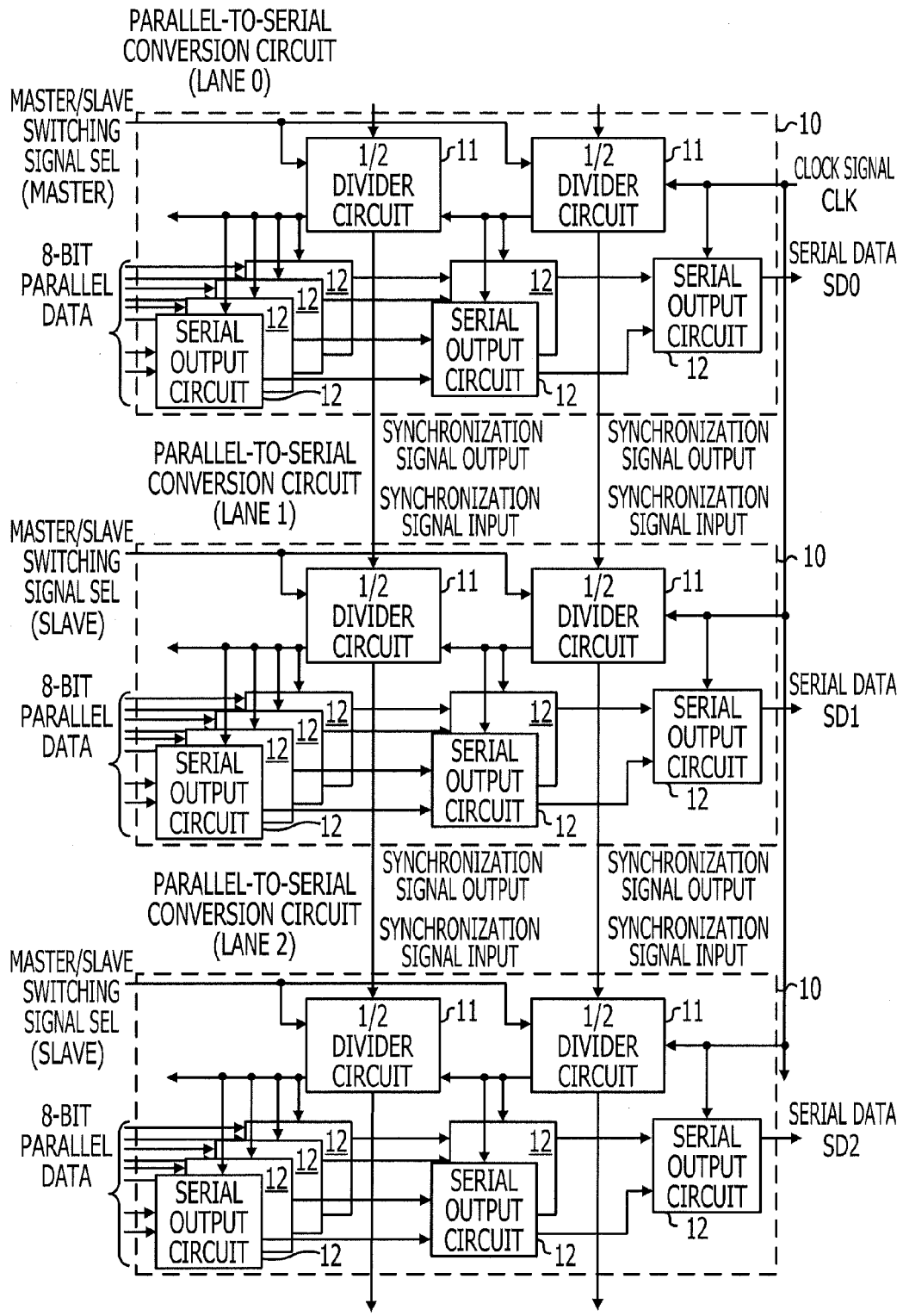
FIG. 1 is a block diagram illustrating parallel-to-serial conversion circuits according to a first embodiment.

FIG. 1 is a block diagram illustrating parallel-to-serial conversion circuits 10 according to a first embodiment. In a system illustrated in FIG. 1, as with the comparison example, the parallel-to-serial conversion circuits 10 are provided for three lanes. The parallel-to-serial conversion circuits 10 convert input 8-bit parallel data into single-bit serial data and output the single-bit serial data. The same clock signal CLK that changes in a certain cycle is supplied to each lane. Pieces of serial data SD0 to SD2, which are the outputs of the lanes, change at unit intervals defined by the CLK cycle, and are output in synchronization with the CLK cycle. FIG. 1 illustrates an example of the parallel-to-serial conversion circuits 10 according to the first embodiment, and data to be input is not limited to the 8-bit parallel data. In addition, the number of lanes to be synchronized with one another according to this embodiment is not limited to 3.

The parallel-to-serial conversion circuits 10 according to the first embodiment convert the 8-bit parallel data into single-bit serial data and output the single-bit serial data. Therefore, as with the comparison example, each parallel-to-serial conversion circuit 10 includes three-stage multiplexer units, namely an initial stage multiplexer unit, an intermediate stage multiplexer unit, and a final stage multiplexer unit. In each parallel-to-serial conversion circuit 10 according to this embodiment, a multiplexer unit located on a side to which an 8-bit parallel signal is input is called the initial stage multiplexer unit. A multiplexer unit located on a side from which serial data is output is called the final stage multiplexer unit. A multiplexer unit located between the initial stage multiplexer unit and the final stage multiplexer unit is called the intermediate stage multiplexer unit. The number of stages of multiplexer units in the parallel-to-serial conversion circuits 10 according to this embodiment is not limited to 3.

Each multiplexer unit in the parallel-to-serial conversion circuits 10 includes a certain number of serial output circuits 12, each having a "two-input, one-output" multiplexer (MUX). The initial stage multiplexer unit has four serial output circuits 12, which convert pieces of 8-bit data input parallel to one another into four lines of serial data and output the four lines of serial data to the intermediate stage multiplexer unit.

The intermediate stage multiplexer unit has two serial output circuits 12, which adjust the four lines of serial data input parallel to one another and convert the four lines of serial data into two lines of serial data, and then output the two lines of serial data to the final stage multiplexer unit. The final stage multiplexer unit is a single serial output circuit 12, which adjusts the two lines of serial data input parallel to each other and converts the two lines of serial data into serial data in which the pieces of 8-bit data input parallel to one another are arranged in a line, and then outputs the serial data. The output of the serial output circuit 12 in the final stage multiplexer unit is the serial data converted by the corresponding lane.

Each parallel-to-serial conversion circuit 10 has first and second ½ divider circuits 11. In each parallel-to-serial conversion circuit 10 according to the first embodiment, a ½ divider circuit 11 located on the side from which serial data is output is called the first ½ divider circuit 11. A ½ divider circuit 11 located on the side to which 8-bit parallel data is input is called the second ½ divider circuit 11. The first ½ divider circuit 11 divides the original frequency of the clock signal CLK supplied to each parallel-to-serial conversion circuit 10 in half. The second ½ divider circuit 11 further divides the clock signal divided by the first ½ divider circuit 11, that is, divides the original frequency of the clock signal CLK into quarters. In each parallel-to-serial conversion circuit 10 according to the first embodiment, the ½ divider circuits 11 are not limited to the two circuits, namely the first and second ½ divider circuits 11.

In the first embodiment, the clock signal CLK is an example of a "clock signal having a second clock cycle", and the ½ clock signals and the ¼ clock signal obtained as a result of the division executed by the ½ divider circuits 11 are examples of a "clock signal having a first clock cycle". In addition, in the first embodiment, the serial output circuit 12 included in each final stage multiplexer unit, to which the clock signal CLK is input, is an example of a "serial output circuit". In addition, in the first embodiment, the serial output circuits 12 included in each initial stage multiplexer unit and each intermediate stage multiplexer unit, to which the signals divided by the ½ divider circuits 11 are input, are examples of a "parallel input circuit".

In the case of the ½ divider circuits 51 according to the comparison example, the outputs of the lanes are synchronized with one another by adjusting the timings of the clock signals (CLK, the ½ clock signals, and the ¼ clock signals) using the reset signals RST that are the same between the lanes. On the other hand, each ½ divider circuit 11 according to the first embodiment has a synchronization signal interface for synchronizing the operation thereof. Using a master/slave switching signal SEL, which is supplied to each lane, whether or not to execute the dividing operation is selected on the basis of a synchronization signal output through the synchronization signal interface. The parallel-to-serial conversion circuits 10 according to this embodiment and the parallel-to-serial conversion circuits 50 according to the comparison example are different from each other in this respect.

When the slave state has been selected, each ½ divider circuit 11 in the parallel-to-serial conversion circuits 10 according to the first embodiment executes the dividing operation on the basis of a synchronization signal input through the synchronization signal interface. Each ½ divider circuit 11 then outputs a signal generated on the basis of the input synchronization signal to a ½ divider circuit 11 in an adjacent lane through the synchronization signal interface.

When the master state has been selected, each ½ divider circuit 11 in the parallel-to-serial conversion circuits 10 according to the first embodiment executes the dividing operation on the basis of a synchronization signal generated thereby that serves as a reference of the dividing operation. Each ½ divider circuit 11 then outputs the synchronization signal generated thereby that serves as a reference of the dividing operation to a ½ divider circuit 11 in an adjacent lane through the synchronization signal interface.

By providing such ½ divider circuits 11 each having the synchronization signal interface function, the parallel-to-serial conversion circuits 10 may synchronize pieces of serial data with one another between the plurality of lanes and output the pieces of serial data. The pieces of output data of the plurality of lanes are pieces of serial data synchronized with one another within 1 UI and arranged in a line. Next, the operation of each ½ divider circuit 11 in the parallel-to-serial conversion circuits 10 according to the first embodiment will be described.

First, the clock signal CLK input to each parallel-to-serial conversion circuit 10 is caused to diverge in the parallel-to-serial conversion circuit 10, while maintaining the original frequency. One half of the divided clock signal CLK is input to the final stage multiplexer unit, and another half is input to the first ½ divider circuit 11.

The ½ divider circuit 11 divides the original frequency of the input clock signal CLK in half in synchronization with the synchronization signal that serves as a reference of the dividing operation, in order to generate a ½ clock signal. Therefore, the ½ clock signal generated by the ½ divider circuit 11 has the same frequency regardless of the status of the master/slave switching signal SEL.

However, because the synchronization signal that serves as a reference of the dividing operation selected by the master/slave switching signal SEL varies, the timings at which the clock signal having half the original frequency generated in synchronization with the synchronization signal rises and falls are also vary. More specifically, the timing at which the signal state rises from the low level to the high level and the timing at which the signal state falls from the high level to the low level are different between the master state and the slave state. In other words, in the parallel-to-serial conversion circuits 10 according to the first embodiment, by switching the status of the master/slave switching signal SEL, it is possible to control the timings at which the clock signals divided by the ½ divider circuits 11 rise and fall.

In FIG. 1, the first ½ divider circuit 11 divides the clock signal CLK using a synchronization signal selected by the mater/slave switching signal SEL as a reference of the dividing operation. As a result of the division executed by the first ½ divider circuit 11, the clock signal CLK becomes the ½ clock signal, which has half the original frequency. When the master state has been selected, the ½ divider circuit 11 generates the synchronization signal that serves as a reference, and then generates the ½ clock signal in synchronization with this synchronization signal and outputs the ½ clock signal. When the slave state has been selected, the ½ divider circuit 11 generates the ½ clock signal in synchronization with the synchronization signal input through the synchronization signal interface and outputs the ½ clock signal. The synchronization signal input through the synchronization signal interface is a synchronization signal generated by a first ½ divider circuit 11 included in an adjacent lane.

The first ½ divider circuit 11 outputs the synchronization signal to a first ½ divider circuit 11 in an adjacent lane through the synchronization signal interface. When the master state has been selected, the first ½ divider circuit 11 outputs the synchronization signal generated thereby. When the slave state has been selected, the first ½ divider circuit 11 outputs a signal generated on the basis of the synchronization signal input through the synchronization signal interface as a synchronization signal.

In FIG. 1, the ½ clock signal generated by the first ½ divider circuit 11 is caused to diverge again and input to the second ½ divider circuit 11 and the intermediate stage multiplexer unit. The ½ clock signal input to the second ½ divider circuit 11 is divided on the basis of the synchronization signal selected by the master/slave switching signal SEL. That is, when the master state has been selected, the second ½ divider circuit 11 generates the synchronization signal that serves as a reference and divides the frequency of the ½ clock signal in synchronization with this synchronization signal. The ½ clock signal divided by the second ½ divider circuit 11 becomes a ¼ clock signal, which has a quarter of the original frequency. The ¼ clock signal generated by the second ½ divider circuit 11 is input to the initial stage multiplexer unit. The second ½ divider circuit 11 when the master state has been selected outputs the synchronization signal generated thereby to a second ½ divider circuit 11 in an adjacent lane through the synchronization signal interface. As illustrated in FIG. 1, the master/slave switching signals SEL supplied to the first and second ½ divider circuits 11 may be selected for each lane.

When the slave state has been selected, the second ½ divider circuit 11 divides the frequency of the ½ clock signal in synchronization with the synchronization signal input thereto through the synchronization signal interface. The synchronization signal input through the synchronization signal interface is a synchronization signal generated by a second ½ divider circuit 11 in an adjacent lane. When the slave state has been selected, the second ½ divider circuit 11 outputs a signal generated on the basis of the synchronization signal input thereto through the synchronization signal interface to a second ½ divider circuit 11 in an adjacent lane as the synchronization signal.

In the parallel-to-serial conversion circuits 10 according to the first embodiment, the operation of each multiplexer unit to which the ¼ clock signal, the ½ clock signal, or the clock signal CLK is input is the same as that of each multiplexer unit according to the comparison example, and therefore description thereof is omitted. Next, a synchronization operation between the lanes based on the operation of the ½ divider circuits 11 will be described.

As illustrated in FIG. 1, the first ½ divider circuit 11 and the second ½ divider circuit 11 communicate the synchronization signals with the corresponding ½ divider circuits 11 in the adjacent lane through the synchronization signal interface. That is, the first ½ divider circuit 11 in Lane 0 outputs the synchronization signal that serves as a reference of the dividing operation to the first ½ divider circuit 11 in Lane 1. The first ½ divider circuit 11 in Lane 1 outputs the synchronization signal that serves as a reference of the dividing operation to the first ½ divider circuit 11 in Lane 2. The second ½ divider circuits 11 operate in the same manner. The second ½ divider circuit 11 in Lane 0 outputs the synchronization signal that serves as a reference of the dividing operation to the second ½ divider circuit 11 in Lane 1. The second ½ divider circuit 11 in Lane 1 outputs the synchronization signal that serves as a reference of the dividing operation to the second ½ divider circuit 11 in Lane 2.

Thus, by connecting the first ½ divider circuits 11 in the lanes to one another through the synchronization signal interfaces included in the first ½ divider circuits 11 in a chain-like manner, the synchronization signal that serves as a reference of the dividing operation may be shared. The first ½ divider circuits 11 in the lanes may obtain the ½ clock signals synchronized with one another between the lanes by executing the dividing operation using the synchronization signals output from the respective adjacent lanes as a reference. The ½ clock signals synchronized with one another between the lanes are supplied to the intermediate stage multiplexer units in the lanes. Each intermediate stage multiplexer unit generates serial data adjusted in synchronization with the supplied ½ clock signal and outputs the serial data. The serial data is output at the timing synchronized between all the lanes.

The second ½ divider circuit 11 in each lane operates in the same manner as the first ½ divider circuit 11. That is, by connecting the second ½ divider circuits 11 in the lanes to one another through the synchronization signal interfaces included in the second ½ divider circuits 11 in a chain-like manner, the synchronization signal that serves as a reference of the dividing operation may be shared. As a result, the ¼ clock signals synchronized with one another between the lanes may be obtained. The ¼ clock signals synchronized with one another between the lanes are input to the initial stage multiplexer units in the lanes. Therefore, the outputs of the initial stage multiplexer units in the lanes adjusted by the ¼ clock signals synchronized with one another between the lanes are output at the timing synchronized between all the lanes. The output of the initial stage multiplexer unit in each lane is four lines of serial data.

In the parallel-to-serial conversion circuits 10 according to the first embodiment, the serial data (4 lines×3 lanes) outputs of the initial stage multiplexer units to which the ¼ clock signals are supplied are input to the intermediate stage multiplexer units at the timing synchronized between all the lanes. The four lines of serial data input to the intermediate stage multiplexer units become two lines of serial data that are parallel to each other adjusted by the ½ clock signals synchronized with one another between the lanes. The two lines of serial data adjusted by the ½ clock signals are input to the final stage multiplexer units at the timing synchronized between all the lanes. In the final stage multiplexer units, the two lines of serial data input parallel to one another are adjusted in synchronization with the clock signals CLK that are the same between all the lanes, in such a way as to be a single-bit data string. Therefore, the output data of the final stage multiplexer units in the lanes is serial data whose bits change at the timing synchronized between all the lanes, thereby realizing synchronization between the lanes.

Next, a synchronization operation to be executed when skew has occurred between the lanes after the power of an information processing apparatus having the parallel-to-serial conversion circuits 10 according to the first embodiment is turned on will be described. As with the comparison example, when the power is turned on, the initial state of each ½ divider circuit 11 included in the parallel-to-serial conversion circuits 10 has not been determined. Therefore, the output values of the ½ divider circuits 11 are not specified. As described in the comparison example, in this state in which the output values are not specified, it is not clear when the serial data output of each multiplexer unit is adjusted and output. Therefore, the outputs of the parallel-to-serial conversion circuits 10 become serial data whose bits change separately in each lane, and skew occurs between the lanes.

In order to reduce skew between the lanes, the parallel-to-serial conversion circuits 50 according to the comparison example use the reset signals RST input to the ½ divider circuits 51. The parallel-to-serial conversion circuits 50 change the statuses of the reset signals RST in all the lanes at a time. The parallel-to-serial conversion circuits 50 according to the comparison example thus reset the output status of each ½ divider circuit 51. The parallel-to-serial conversion circuits 50 according to the comparison example then synchronize the lanes with one another again when a first clock signal has been input after the reset. The parallel-to-serial conversion circuits 50 that have been synchronized with one another between the lanes synchronize the dividing operations of the ½ divider circuits 51 with one another between the lanes again, in order to reduce the skew between the lines. On the other hand, in this embodiment, by setting the signal status of the master/slave switching signal SEL input to each lane in a certain manner, that is, for example, by setting the signal status in Lane 0 to the master state and those in Lanes 1 and 2 to the slave state, the skew that has occurred between the lanes is automatically reduced.

As described above, the ½ divider circuits 11 included in the parallel-to-serial conversion circuits 10 according to the first embodiment each have the interface for a synchronization signal that serves as a reference of the dividing operation. The ½ divider circuits 11 may share the synchronization signal with the respective adjacent lanes. If all the lanes are in the slave state, each ½ divider circuit 11 executes the dividing operation using the synchronization signal input through the synchronization signal interface as a reference. As a result, the ¼ clock signals and the ½ clock signals change at the timing synchronized between the lanes. In this embodiment, one of the lanes is set to the master state, and a synchronization signal generated in the master lane is output to the slave lanes through the synchronization signal interfaces. As a result, the parallel-to-serial conversion circuits 10 according to this embodiment may reduce the skew that has occurred between the lanes because of the irregular outputs of the ½ divider circuits 11. After the skew between the lanes is reduced, each parallel-to-serial conversion circuit 10 uses the synchronization signal generated in the master lane as a reference of the dividing operation, and the slave lanes execute the dividing operations. Therefore, the parallel-to-serial conversion circuits 10 according to this embodiment may synchronize pieces of serial data with one another between the lanes again and output the pieces of serial data.

In the parallel-to-serial conversion circuits 10 illustrated in FIG. 1, for example, the master/slave switching signals SEL supplied to Lanes 1 and 2 are set to the slave state, and the status of the master/slave switching signal SEL input to Lane 0 is switched to the master state. The master/slave switching signal SEL supplied to each lane is common to the first and second ½ divider circuits 11. Therefore, in the following description, the synchronization operation will be described mainly with regard to the first ½ divider circuit 11.

The first ½ divider circuit 11 in Lane 0 is set to the master state. In accordance with a change in the status of the master/slave switching signal SEL, the first ½ divider circuit 11 in Lane 0 switches the synchronization reference for executing the dividing operation to the signal generated thereby. The first ½ divider circuit 11 in Lane 0 then outputs the signal generated thereby to the adjacent lane, namely Lane 1, as a synchronization signal that serves as a reference of the dividing operation. The synchronization signal is output to Lane 1 through the synchronization signal interface. In addition, the first ½ divider circuit 11 in Lane 0 divides the input clock signal CLK having the original frequency in synchronization with the synchronization reference generated thereby. A ½ clock signal obtained as a result of the division executed by the first ½ divider circuit 11 in Lane 0 is input to the intermediate stage multiplexer unit and the second ½ divider circuit 11 in Lane 0.

The synchronization signal output from the first ½ divider circuit 11 in Lane 0 is input to the first ½ divider circuit 11 in Lane 1. The transmission and reception of the synchronization signal between Lanes 0 and 1 are executed through the synchronization signal interface that connects the first ½ divider circuits 11 in Lanes 0 and 1. The synchronization signal output to Lane 1 through the synchronization signal interface is input to the first ½ divider circuit 11 in Lane 1. The first ½ divider circuit 11 in Lane 1, which is in the slave state, executes the dividing operation using the synchronization signal input through the synchronization signal interface as a reference. The first ½ divider circuit 11 in Lane 1 divides the clock signal CLK having the original frequency in synchronization with the input synchronization signal. A ½ clock signal generated by the first ½ divider circuit 11 in Lane 1 is input to the intermediate stage multiplexer unit and the second ½ divider circuit 11 in Lane 1 in synchronization with the ½ clock signal in Lane 0. The first ½ divider circuit 11 in Lane 1, which is in the slave state, outputs the synchronization signal that has been used as a reference of the dividing operation to Lane 2 through a synchronization signal interface.

The synchronization signal output from the first ½ divider circuit 11 in Lane 1 to Lane 2 through the synchronization signal interface is input to the first ½ divider circuit 11 in Lane 2. As with Lane 1, Lane 2, which is in the slave state, executes the dividing operation using the synchronization signal input through the synchronization signal interface as a reference. The first ½ divider circuit 11 in Lane 2 divides the clock signal CLK having the original frequency in synchronization with the input synchronization signal to generate a ½ clock signal in Lane 2. The ½ clock signal generated by the first ½ divider circuit 11 in Lane 2 is input to the intermediate stage multiplexer unit and the second ½ divider circuit 11 in Lane 2 in synchronization with the ½ clock signal in Lane 1.

As described above, the parallel-to-serial conversion circuits 10 according to the first embodiment may synchronize the clock signals with one another between the lanes by setting the status of the master/slave switching signal SEL input to Lane 0 to the master state and those of the master/slave switching signals SEL input to the other lanes to the slave state. The ½ clock signal generated by the first ½ divider circuit 11 in Lane 1 is synchronized with the ½ clock signal generated by the first ½ divider circuit 11 in Lane 0. The ½ clock signal generated by the first ½ divider circuit 11 in Lane 2 is synchronized with the ½ clock signal generated by the first ½ divider circuit 11 in Lane 1. Thus, the ½ clock signals in all the lanes are synchronized with the ½ clock signal in Lane 0, which has been set to the master state. The synchronization of the dividing operations with one another between the lanes is also executed in the same manner by the second ½ divider circuits 11. That is, ¼ clock signals obtained as a result of division executed by the second ½ divider circuits 11 in Lanes 1 and 2, which are in the slave state, are synchronized with a ¼ clock signal obtained as a result of division executed by the second ½ divider circuit 11 in Lane 0, which is in the master state.

As described above, in the parallel-to-serial conversion circuits 10 according to this embodiment, the ¼ clock signals, the ½ clock signals, and the clock signals CLK change at the timing synchronized between all the lanes. Each clock signal is a signal for adjusting 8-bit parallel data input to each lane and converting the 8-bit parallel data into serial data. The synchronization of the clock signals with one another may be executed by setting the status of the master/slave switching signal SEL in each lane.

In this embodiment, skew that occurs between the lanes when the power is turned on may be automatically reduced when the clock synchronization signals are transmitted to all the lanes by configuring the entirety of the circuit such that the master/slave switching signal SEL in Lane 0 is set to the master state and the master/slave switching signals SEL in Lanes 1 and 2 to the slave state. Therefore, it is possible to synchronize the lanes with one another again.

As described above, according to this embodiment, each ½ divider circuit 11 has the synchronization signal interface. Each ½ divider circuit 11 may output a synchronization signal that serves as a reference of the dividing operation to an adjacent lane through the synchronization signal interface. As a result, the synchronization operation may be executed between the lanes. The ½ divider circuits 11 may be operated while any of the plurality of lanes is set to the master state, which serves as a reference, and the other lanes are set to the slave state. In this embodiment, the synchronization signals generated by the ½ divider circuits 11 in the lane that has been set to the master state to serve as a reference are transmitted to the other lanes through the synchronization signal interfaces that are connected to one another in a chain-like manner, and therefore the clock signals in the lanes are synchronized with one another without executing a particular operation. Thus, the skew that has occurred between the lanes is automatically reduced.

In this embodiment, the reset signals that are the same between all the lanes are not used. Therefore, the parallel-to-serial conversion circuits 10 do not include a distribution circuit having a complex function of adjusting the timing for distribution of the reset signals. In addition, in this embodiment, the configuration of the circuits for synchronizing the lanes with one another is simple. Furthermore, in this embodiment, even if the data transmission speed increases, the serial data outputs in the lane that has been selected as the master and the adjacent lane that has been selected as the slave may be arranged in a line and synchronized with each other within 1 UI.

Next, the parallel-to-serial conversion circuit 10 according to the first embodiment will be described in detail. The operation of each component and the timing thereof will be described.

Parallel-to-Serial Conversion Circuit 10

Figure 2:
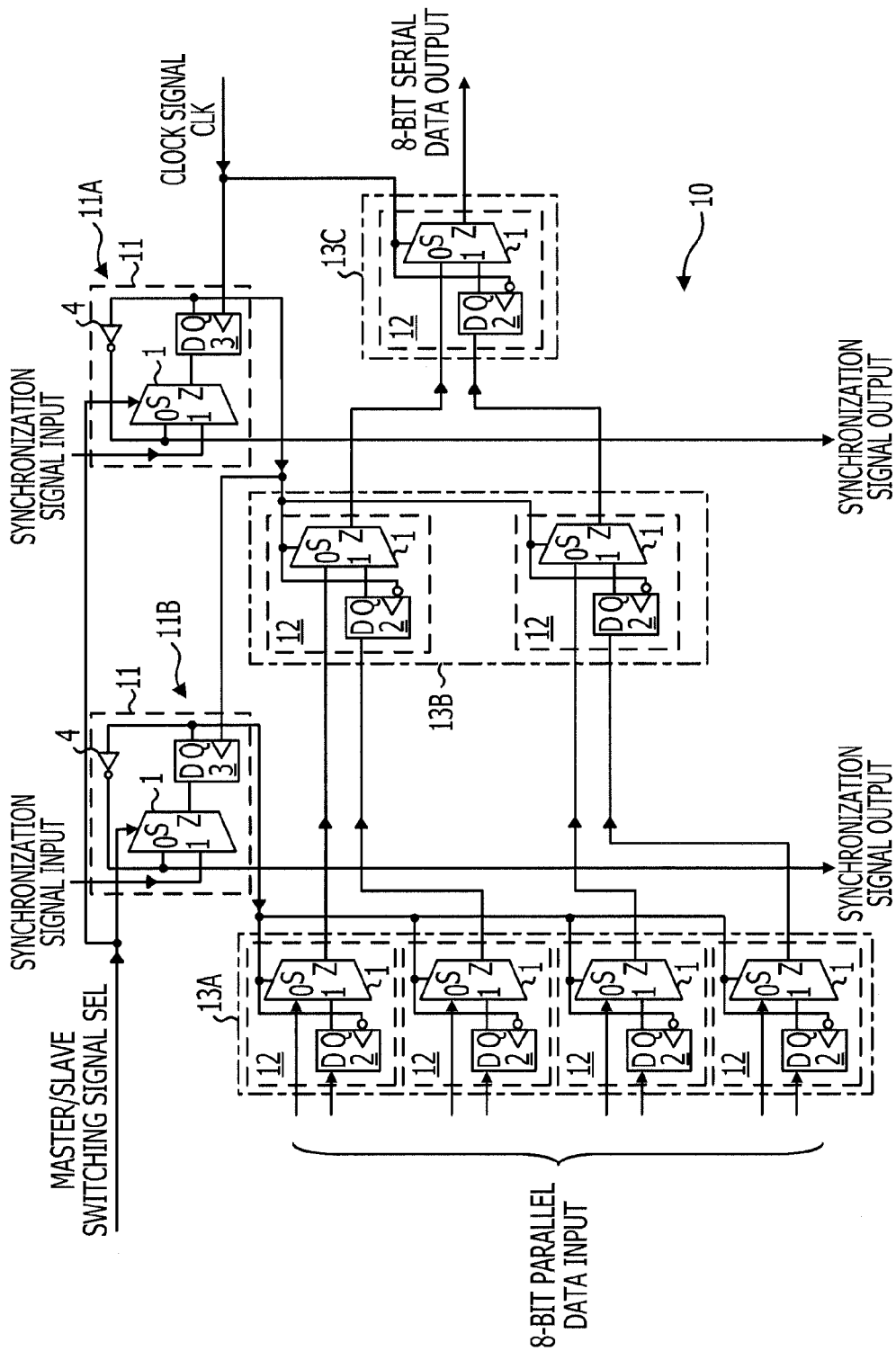
FIG. 2 is a diagram illustrating an example of the parallel-to-serial conversion circuit.

FIG. 2 illustrates an example of the parallel-to-serial conversion circuit 10. The parallel-to-serial conversion circuit 10 illustrated in FIG. 2 is an example of a single lane that adjusts pieces of 8-bit data input parallel to one another using a clock signal CLK and that outputs serial data having a single-bit string. The parallel-to-serial conversion circuit 10 illustrated in FIG. 2 has a first ½ divider circuit 11A and a second ½ divider circuit 11B in order to adjust the pieces of 8-bit data input parallel to one another using the clock signal CLK. The 8-bit serial data obtained as a result of conversion executed by the parallel-to-serial conversion circuit 10 changes at unit intervals defined by the CLK cycle and is output in synchronization with the CLK cycle. The same master slave switching signals SEL are supplied to the first ½ divider circuit 11A and the second ½ divider circuit 11B. Each ½ divider circuit 11 has a "two-input, one-output" multiplexer 1, a D flip-flop 3, and an inverter 4.

The parallel-to-serial conversion circuit 10 also has a plurality of serial output circuits 12. Each serial output circuit 12 has a "two-input, one-output" multiplexer 1 and a D flip-flop 2. In order to convert the pieces of 8-bit data input parallel to one another, the parallel-to-serial conversion circuit 10 has an initial stage multiplexer unit 13A, an intermediate stage multiplexer unit 13B, and a final stage multiplexer unit 13C.

The initial stage multiplexer unit 13A has four serial output circuits 12, and a ¼ clock signal obtained as a result of division executed by the second ½ divider circuit 11B is supplied to each of the serial output circuits 12. The intermediate stage multiplexer unit 13B has two serial output circuits 12, and a ½ clock signal obtained as a result of division executed by the first ½ divider circuit 11B is supplied to each of the serial output circuits 12. The final stage multiplexer unit 13C has a single serial output circuit 12, and the clock signal CLK having the original frequency is supplied to the serial output circuit 12.

The 8-bit parallel data input to the parallel-to-serial conversion circuit 10 is converted into four lines of serial data by the initial stage multiplexer unit 13A. The four lines of serial data are serial data adjusted by the ¼ clock signals obtained as a result of the division executed by the second ½ divider circuit 11B. Each line of serial data that has been converted changes at unit intervals defined by the status cycle of the ¼ clock signal and is synchronized with the cycle of the ¼ clock signal. The four lines of serial data adjusted by the initial stage multiplexer unit 13A are input to the intermediate stage multiplexer unit 13B.

The four lines of serial data input to the intermediate stage multiplexer unit 13B are converted into two lines of serial data by the ½ clock signals obtained as a result of the division executed by the first ½ divider circuit 11A. Each line of serial data that has been converted changes at unit intervals defined by the status cycle of the ½ clock signal and is synchronized with the cycle of the ½ clock signal. The two lines of serial data adjusted by the intermediate stage multiplexer unit 13B are input to the final stage multiplexer unit 13C.

In the final stage multiplexer unit 13C, the two lines of serial data are further adjusted by the clock signal CLK having the original frequency. The two lines of serial data adjusted by the clock signal CLK having the original frequency are converted into serial data having a single-bit string. The serial data having a single-bit string obtained as a result of the conversion changes at unit intervals defined by the status cycle of the clock signal CLK and is synchronized with the CLK cycle. The output data of the final stage multiplexer unit 13C is the serial data obtained by adjusting the 8-bit parallel data input to the parallel-to-serial conversion circuit 10.

In the parallel-to-serial conversion circuit 10 illustrated in FIG. 2, the clock signal CLK is an example of a "clock signal having a second clock cycle", and the ½ clock signals and the ¼ clock signals obtained as a result of the division executed by the ½ divider circuits 11 are examples of a "clock signal having a first clock cycle". In addition, in the parallel-to-serial conversion circuit 10 illustrated in FIG. 2, the serial output circuit 12 included in the final stage multiplexer unit 13C to which the clock signal CLK is input is an example of a "serial output circuit". In addition, in the parallel-to-serial conversion circuit 10 illustrated in FIG. 2, the serial output circuits 12 included in the initial stage multiplexer unit 13A and the intermediate stage multiplexer unit 13B to which the signals obtained as a result of the division executed by the ½ divider circuits 11 are input are examples of a "parallel input circuit".

The multiplexer 1 included in each ½ divider circuit 11 and each serial output circuit 12 is a logic circuit that selects a signal from a plurality of input signals and outputs the signal. In the parallel-to-serial conversion circuit 10 illustrated in FIG. 2, each multiplexer 1 selects either a signal input to a "0" terminal or a signal input to a "1" terminal in accordance with a status input to a selector S. The input signal selected in accordance with the status of the selector S is output as an output signal of the multiplexer 1. When the switching status of the selector S of each multiplexer 1 is a "0" state, the signal input to the "0" terminal is selected, and when the switching status is a "1" state, the signal input to the "1" terminal is selected.

The D flip-flop 2 included in each serial output circuit 12 is a logic circuit that operates in synchronization with a clock signal. The clock signals input to the D flip-flops 2 are signals whose signal levels periodically change at certain unit intervals defined by the cycle thereof. Each clock signal repeats rising and falling in the cycle thereof. Each D flip-flop 2 operates upon a negative edge, which is falling of an input clock signal.

Each D flip-flop 2 holds the signal state input to a "D" terminal thereof upon falling of the clock signal, and keeps holding the signal state until the next falling of the clock signal is input in the cycle of the clock signal. The signal state of the "D" terminal held upon the falling of the clock signal is output from a "Q" terminal as the output of the D flip-flop 2. The signal state held upon the falling of the clock signal does not change until the next falling of the clock signal is input in the cycle of the clock signal. The signal state of the output of each D flip-flop 2 does not change even if the input state of the "D" terminal changes before the next falling of the clock signal is input in the cycle of the clock signal.

The D flip-flop 3 included in each ½ divider circuit 11 is a logic circuit that operates in synchronization with a clock signal. The clock signals input to the D flip-flop 3 are signals whose signal levels periodically change at certain unit intervals defined by the cycle thereof. The clock signals repeat rising and falling in the cycle thereof. In the parallel-to-serial conversion circuit 10 illustrated in FIG. 2, each D flip-flop 3 operates upon a positive edge, which is rising of an input clock signal. The opposite relationship between the D flip-flops 2 and the D flip-flops 3 may be used instead. That is, when the D flip-flops 2 operate upon positive edges, the D flip-flops 3 may operate upon negative edges.

Each D flip-flop 3 holds the signal state input to a "D" terminal thereof upon rising of the clock signal, and keeps holding the signal state until the next rising of the clock signal is input in the cycle of the clock signal. The signal state of the "D" terminal held upon the rising of the clock signal is output from a "Q" terminal as the output of the D flip-flop 3. The signal state held upon the rising of the clock signal does not change until the next rising of the clock signal is input in the cycle of the clock signal. The signal state of the output of each D flip-flop 3 does not change even if the input state of the "D" terminal changes before the next rising of the clock signal is input in the cycle of the clock signal.

The inverter 4 in each ½ divider circuit 11 is a logic circuit that inverts an input signal and outputs the inverted signal. For example, when the input logic value is 1, an inverted logic value, namely 0, is output, and when the input logic value is 0, an inverted logic value, namely 1, is output.

Operation of ½ Divider Circuits 11

Next, the circuit operation of the ½ divider circuits 11 will be described by taking the first ½ divider circuit 11A as an example. The clock signal CLK supplied to the parallel-to-serial conversion circuit 10 is input to a clock signal input terminal of the D flip-flop 3 included in the first ½ divider circuit 11A. The D flip-flop 3 holds the signal state input to the "D" terminal and outputs the signal state from the "Q" terminal in synchronization with rising of the clock signal CLK. Therefore, the output of the "Q" terminal of the D flip-flop 3 synchronizes with the rising of the clock signal CLK and changes in a cycle twice as long as that of the clock signal CLK.

The signal output from the "Q" terminal of the D flip-flop 3 is caused to diverge and input to the inverter 4. The inverter 4 inverts the logic value of the input signal and outputs the inverted logic value. Therefore, rising of the signal output from the "Q" terminal of the D flip-flop 3 becomes falling because of the inverted logic value, and is output from the inverter 4. In addition, falling of the signal output from the "Q" terminal of the D flip-flop 3 becomes rising because of the inverted logic value, and is output from the inverter 4. Thus, by providing the inverter 4 that inverts logic values, for example, the output phase of a signal that periodically changes, such as a clock signal, may be shifted from the input phase by approximately half a cycle. Therefore, in each ½ divider circuit 11, the signal phases of the output of the "Q" terminal of the D flip-flop 3 and the output of the inverter 4 are relatively different from each other by approximately half a cycle.

The output signal of the inverter 4 is input to the "0" terminal of the multiplexer 1 included in the ½ divider circuit 11. A synchronization signal output from an adjacent lane through a synchronization signal interface is input to the "1" terminal of the multiplexer 1 included in the ½ divider circuit 11. The multiplexer 1 included in the ½ divider circuit 11 selects either the signal input to the "0" terminal or the signal input to the "1" terminal in accordance with the status ("1" or "0") input to the selector S, and outputs the selected signal. Therefore, by switching the status of the master/slave switching signal SEL supplied to the selector S of the multiplexer 1, the input signal state of the "D" terminal of the D flip-flop 3 may be selected.

In each ½ divider circuit 11 illustrated in FIG. 2, by setting the status of the master/slave switching signal SEL to "0" (master state), the output signal of the "Q" terminal of the D flip-flop 3 whose logic value has been inverted by the inverter 4 may be selected. On the other hand, by setting the status of the master/slave switching signal SEL to "1" (slave state), the synchronization signal output from the adjacent lane through the synchronization signal interface may be selected. The output signal of the multiplexer 1 selected by the master/slave switching signal SEL is input to the "D" terminal of the D flip-flop 3. The D flip-flop 3 holds the output signal of the multiplexer 1 input to the "D" terminal upon rising of the clock signal CLK. The D flip-flop 3 then keeps outputting the held signal from the "Q" terminal thereof until the next rising of the clock signal CLK is input in the CLK cycle. Therefore, the signal output from the "Q" terminal of the D flip-flop 3 becomes a signal whose status changes in the cycle of the clock signal CLK. That is, the signal output from the "Q" terminal of the D flip-flop 3 becomes a ½ clock signal obtained by dividing the frequency of the clock signal CLK in half. The ½ clock signal changes in a cycle twice as long as that of the clock signal CLK. As illustrated in FIG. 2, the output signal of the inverter 4 input to the "0" terminal of the multiplexer 1 is output through the synchronization signal interface as a synchronization signal input to the ½ divider circuit 11 in the adjacent lane.

In each ½ divider circuit 11 illustrated in FIG. 2, if the master state is selected, the output signal of the "Q" terminal whose logic value has been inverted by the inverter 4 and whose phase has been shifted by approximately half a cycle is input to the "D" terminal of the D flip-flop 3. The output signal of the inverter 4 is a signal whose status periodically changes in synchronization with the clock signal CLK supplied to the D flip-flop 3. Therefore, the output signal of the inverter 4 whose status is stable is supplied to the "D" terminal of the D flip-flop 3 in synchronization with rising of the clock signal CLK. Therefore, each ½ divider circuit 11 having the D flip-flop 3 may provide a stable ½ clock signal.

In addition, in each ½ divider circuit 11, if the slave state is selected, the synchronization signal output from the adjacent lane through the synchronization signal interface is input to the "D" terminal of the D flip-flop 3. As described above, in each ½ divider circuit 11 illustrated in FIG. 2, the input signal of the "0" terminal of the multiplexer 1 is output to the adjacent lane through the synchronization signal interface as a synchronization signal. That is, the synchronization signal output from the ½ divider circuit 11 through the synchronization signal interface is the output signal of the "Q" terminal of the D flip-flop 3 whose logic value has been inverted by the inverter 4 and whose phase has been shifted by approximately half a cycle. Therefore, as in the master state, the synchronization signal output through the synchronization signal interface is input to the "D" terminal of the D flip-flop 3. For this reason, a signal whose status periodically changes is supplied to the "D" terminal in accordance with rising of the clock signal CLK in the adjacent lane. Therefore, even in the slave state, each ½ divider circuit 11 may provide a stable ½ clock signal.

Thus, in each ½ divider circuit 11 illustrated in FIG. 2, a stable synchronization signal that serves as a reference of the dividing operation may be obtained regardless of the master or slave state. The ½ divider circuit 11 outputs the output signal of the "Q" terminal of the D flip-flop 3 whose logic value has been inverted by the inverter 4 and whose phase has been shifted by approximately half a cycle to the adjacent lane through the synchronization signal interface as a synchronization signal. As a result, divided signals (½ clock signals and ¼ clock signals) synchronized with one another between the adjacent lanes may be obtained. Therefore, even if the number of lanes is 3 or more, the divided signals are synchronized with one another between the lanes.

Operation of Serial Output Circuit 12

Next, the circuit operation of the serial output circuits 12 will be described by taking the serial output circuit 12 included in the final stage multiplexer unit 13C illustrated in FIG. 2 as an example. In the serial output circuit 12 included in the final stage multiplexer unit 13C illustrated in FIG. 2, the clock signals CLK having the original frequency are input to the multiplexer 1 and the D flip-flop 2. The clock signal CLK is input to the selector S of the multiplexer 1. The multiplexer 1 switches the output of the multiplexer 1 in synchronization with changes in the status of the clock signal CLK.

The status of the clock signal CLK changes at unit intervals defined by the CLK cycle. When the status of the clock signal CLK is "0", the multiplexer 1 selects a signal input to a "0" terminal and outputs the signal. When the status of the clock signal CLK is "1", the multiplexer 1 selects a signal input to a "1" terminal and outputs the signal. The clock signal CLK input to the selector S of the multiplexer 1 periodically changes at unit intervals defined by the CLK cycle, that is, the statuses "0" and "1" are alternately repeated. Therefore, bit strings of signals input to the "0" terminal and signals input to the "1" terminal that have been arranged in a line in synchronization with the clock signal CLK are sequentially output to a "Z" terminal of the multiplexer 1.

In the serial output circuit 12 included in the final stage multiplexer unit 13C illustrated in FIG. 2, the clock signal CLK having the original frequency is supplied to a clock input terminal of the D flip-flop 2. The D flip-flop 2 operates upon a negative edge, which is falling of the input clock signal CLK. The clock signal CLK is a signal whose signal level periodically changes at certain unit intervals defined by the CLK cycle. The clock signal CLK repeatedly rises and falls in the CLK cycle. The D flip-flop 2 holds a signal state input to a "D" terminal and outputs the signal state from a "Q" terminal in synchronization with falling of the clock signal CLK. A signal output from the "Q" terminal of the D flip-flop 2 is input to the "1" terminal of the multiplexer 1. The output signal of the "Q" terminal of the D flip-flop 2 changes in synchronization with falling of the clock signal CLK. The output signal state of the "Q" terminal does not change until the next falling of the clock signal CLK is input in the CLK cycle. That is, the signal state input to the "1" terminal of the multiplexer 1 does not change at the certain unit intervals defined by the cycle of the clock signal CLK.

In the serial output circuit 12 included in the final stage multiplexer unit 13C, the status of the signal input to the "1" terminal of the multiplexer 1 periodically changes in the cycle of falling of the clock signal CLK. On the other hand, the status of the signal input to the "0" terminal of the multiplexer 1 changes in the cycle of rising of the clock signal CLK. The multiplexer 1 switches the output of the multiplexer 1 in synchronization with changes in the status of the clock signal CLK. Therefore, the multiplexer 1 sequentially outputs the input signal status of the "1" terminal and the input signal status of the "0" terminal, each having a unit interval of data of half a CLK cycle, within one CLK cycle.

Synchronization Operation Between Lanes

Figure 3:
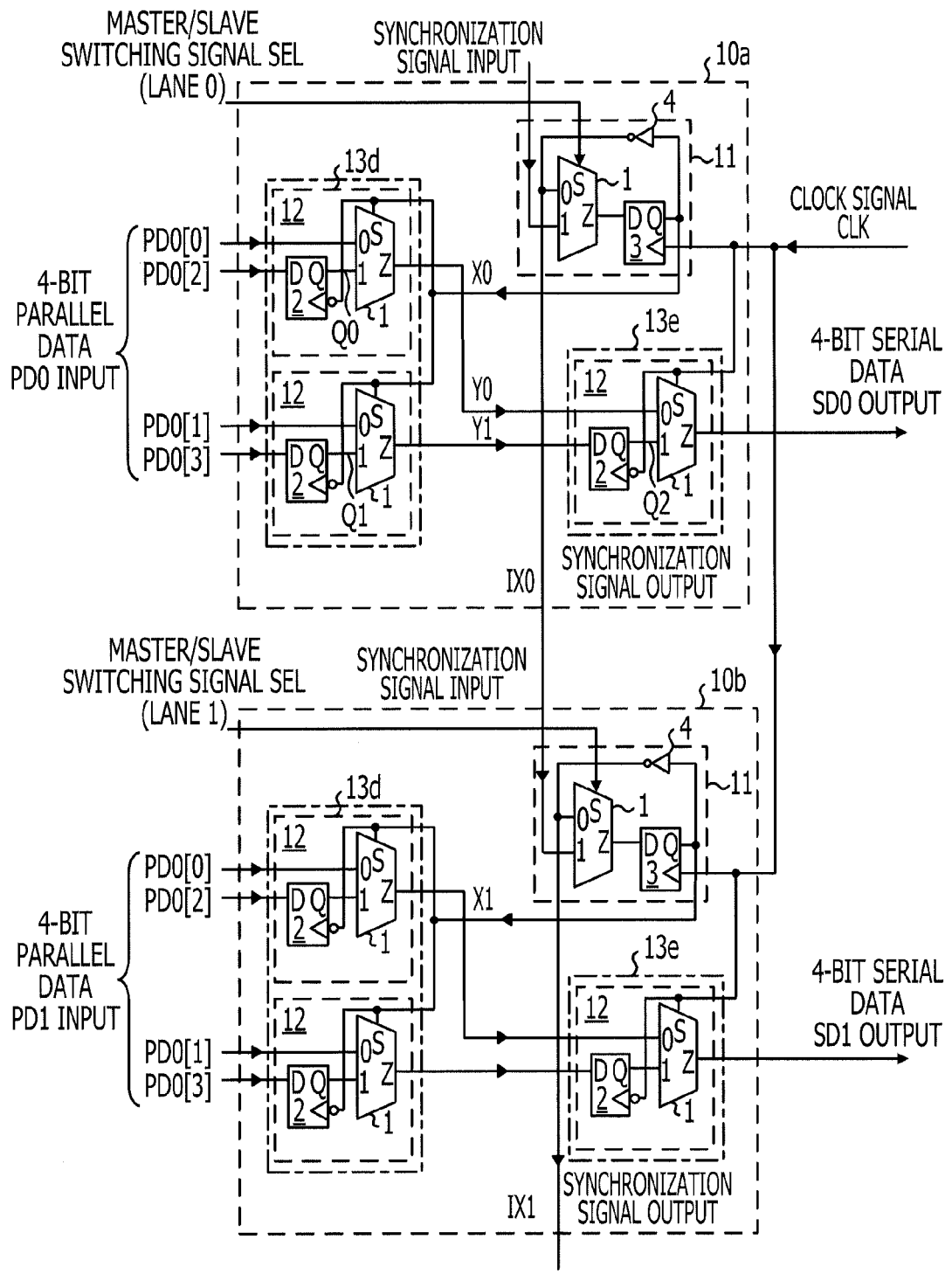
FIG. 3 is a block diagram illustrating synchronization operation between lanes.
Figure 4:
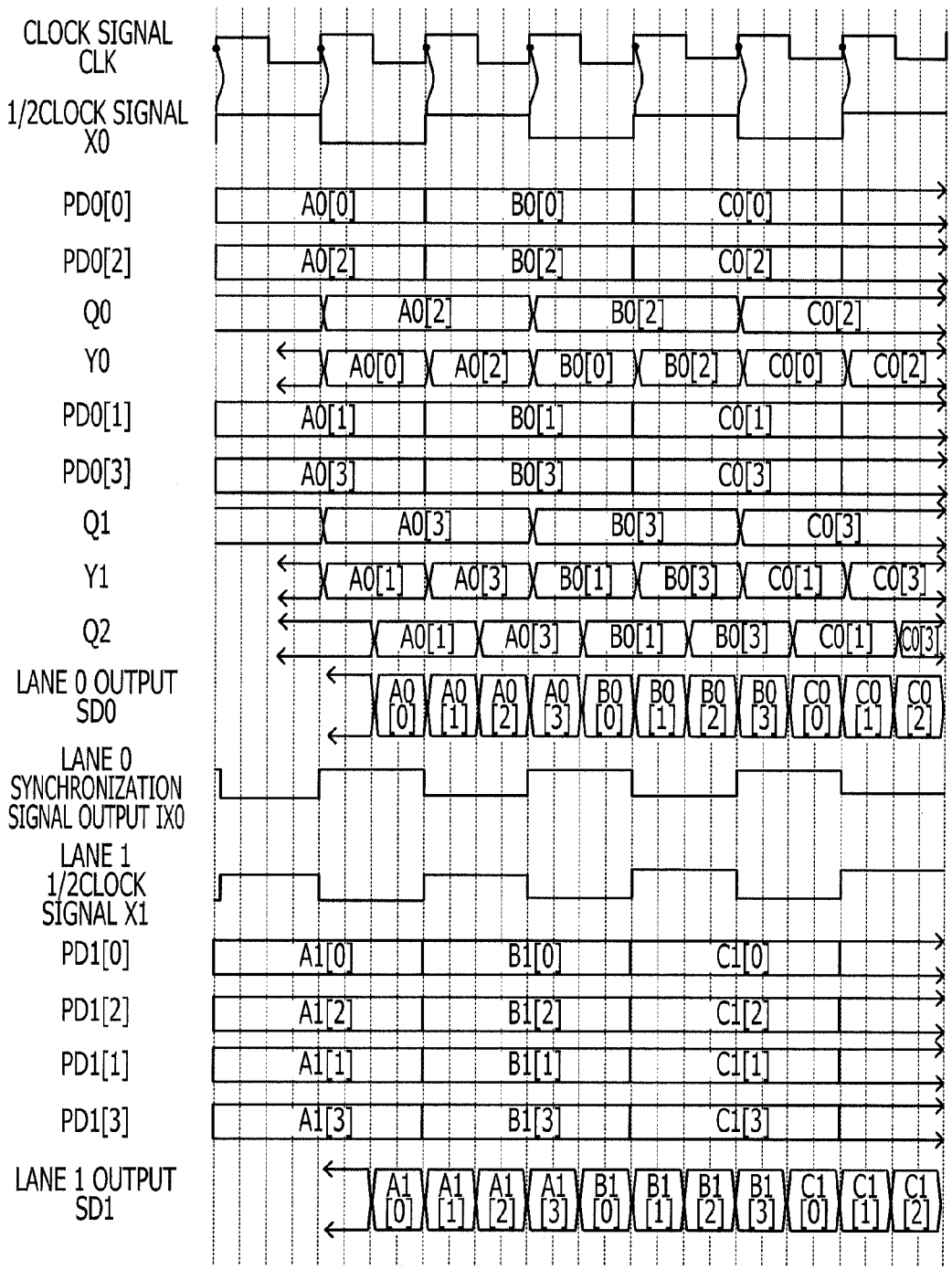
FIG. 4 is a timing chart illustrating the synchronization operation between the lanes.

Next, a synchronization operation between the lanes executed by parallel-to-serial conversion circuits including ½ divider circuits 11 and serial output circuits 12 will be described with reference to FIGS. 3 and 4. FIGS. 3 and 4 are diagrams illustrating the synchronization operation between the lanes. FIG. 3 illustrates an example of parallel-to-serial conversion circuits that convert 4-bit parallel data into serial data. The parallel-to-serial conversion circuits illustrated in FIG. 3 each have an initial stage multiplexer unit 13d including a single ½ divider circuit 11 and two serial output circuits 12 and a final stage multiplexer unit 13e including a single serial output circuit 12. In FIG. 3, a parallel-to-serial conversion circuit 10a, as Lane 0, outputs 4-bit serial data SD0. A parallel-to-serial conversion circuit 10b, as Lane 1, outputs 4-bit serial data SD1. Lane 0 receives 4-bit parallel data PD0 and Lane 1 receives 4-bit parallel data PD1. The pieces of parallel data PD0 and PD1 change at a synchronized timing. FIG. 4 is a timing chart of the parallel-to-serial conversion circuits 10a and 10b illustrated in FIG. 3, which operate as two lanes.

As illustrated in FIGS. 3 and 4, the 4-bit parallel data PD0 input to Lane 0 includes data strings A0, B0, and C0 that change in a certain cycle. The 4-bit parallel data PD1 input to Lane 1 includes data strings A1, B1, and C1 that change in synchronization with the 4-bit parallel data PD0. Each data string has data blocks [0 to 3] of 4 bits. The data blocks are configured by bit values. For example, the data string A0 includes pieces of bit data A0[0], A0[1], A0[2], and A0[3], which are data blocks, each having 1 bit and having 4 bits in total. This holds true for the data strings B0, B1, C0, and C1. The 4-bit serial data SD0, which is the output of Lane 0, is data obtained by adjusting the data blocks included in each data string of the 4-bit parallel data PD0. For example, when the data blocks [0 to 3] of the data string A0 have been adjusted, serial data in which "A0[0]", "A0[1]", "A0[2]", and "A0[3]", each having a single bit value, are sequentially arranged is obtained. This holds true for the 4-bit serial data SD1, which is the output of Lane 1. That is, the 4-bit serial data SD1 is data obtained by adjusting the data blocks included in each data string of the 4-bit parallel data PD1.

A master/slave switching signal SEL is supplied to each lane, that is, each parallel-to-serial conversion circuit illustrated in FIG. 3. In addition, the same clock signals CLK having the original frequency are supplied to all the lanes. The master/slave switching signal SEL is input to a multiplexer 1 included in each ½ divider circuit 11. The status of the master/slave switching signal SEL in Lane 0 is in the "0" state, that is, Lane 0 is set as a synchronization signal master for synchronization between the lanes. Therefore, the ½ divider circuit 11 in Lane 0 generates a signal that serves as a reference of the dividing operation. The ½ divider circuit 11 in Lane 0 generates a signal that serves as a reference of the dividing operation by inverting the logic value of an output signal of a "Q" terminal of a D flip-flop 3 using an inverter 4. An output signal of the inverter 4 is input to a "D" terminal of the D flip-flop 3 through the multiplexer 1 included in the ½ divider circuit 11. The ½ divider circuit 11 in Lane 0 generates a ½ clock signal X0 having half the original frequency from the signal that serves as a reference of the dividing signal input to the "D" terminal of the D flip-flop 3. The ½ clock signal X0 is a clock signal obtained by dividing the clock signal CLK supplied to the ½ divider circuit 11 in Lane 0. In addition, the ½ divider circuit 11 in Lane 0 outputs the output signal of the inverter 4, which serves as a reference of the dividing operation, to Lane 1, which is an adjacent lane, through a synchronization signal interface as a synchronization signal output IX0 that serves as a reference of the dividing operation.

The status of the master/slave switching signal SEL in Lane 1 illustrated in FIG. 3 is in the "1" state, that is, Lane 1 is set as a synchronization signal slave for synchronization between the lanes. Therefore, the ½ divider circuit 11 in Lane 1 uses the synchronization signal output IX0 output from adjacent Lane 0 through the synchronization signal interface as a reference of the dividing operation. The synchronization signal output IX0 is input to a multiplexer 1 included in the ½ divider circuit 11 in Lane 1 through the synchronization signal interface. The synchronization signal output IX0 input to the multiplexer 1 in Lane 1 through the synchronization signal interface is input to a "1" terminal. The ½ divider circuit 11 in Lane 1 selects the synchronization signal output IX0 input to the "1" terminal of the multiplexer 1 as a synchronization signal that serves as a reference of the dividing operation in Lane 1.

The selected synchronization signal output IX0 is output to a "Z" terminal of the multiplexer 1. The synchronization signal output IX0 output to the "Z" terminal of the multiplexer 1 is input to the "D" terminal of the D flip-flop 3 included in the ½ divider circuit 11 in Lane 1. The D flip-flop 3 holds the signal state of the synchronization signal output IX0 input to the "D" terminal thereof upon rising of the clock signal CLK. The signal state of the synchronization signal output IX0 held upon the rising of the clock signal CLK is output from the "Q" terminal of the D flip-flop 3. The clock signal CLK input to the D flip-flop 3 included in the ½ divider circuit 11 in Lane 1 is the same signal as the clock signal CLK input to Lane 0.

In FIG. 4, the synchronization signal output IX0 of Lane 0 changes in synchronization with the clock signal CLK. The signal state of the synchronization signal output IX0 changes in a cycle twice as long as that of the clock signal CLK. Therefore, the output of the "Q" terminal of the D flip-flop 3 in Lane 1 held upon rising of the clock signal CLK becomes a ½ clock signal X1 in Lane 1 that changes at the same timing as the ½ divided signal X0 generated by the ½ divider circuit 11 in Lane 0. As a result, the ½ clock signal X0 in Lane 0 set as the synchronization signal master and the ½ clock signal X1 in Lane 1 in the slave state that has been obtained by outputting the synchronization signal output IX0 from Lane 0 through the synchronization signal interface are synchronized with each other.

Thus, by outputting a synchronization signal that serves as a reference of the dividing operation to an adjacent lane through the synchronization signal interface, divided clock signals for adjusting parallel data may be stably synchronized. In FIG. 3, the ½ clock signal X0 generated in Lane 0 and the ½ clock signal X1 generated in Lane 1 change at a synchronized timing.

The logic value of the ½ clock signal X1 generated by the ½ divider circuit 11 in Lane 1 is inverted by the inverter 4. The inverted output of the inverter 4 is output to an adjacent lane through a synchronization signal interface as a synchronization signal output IX1 that serves as a reference of the dividing operation. For example, the adjacent lane set to the slave state selects the synchronization signal output IX1 as a synchronization signal that serves as a reference of the dividing operation to be executed in the lane. Therefore, a ½ clock signal generated by the adjacent lane and the ½ clock signal X1 are synchronized with each other.

The output of the "Q" terminal of the D flip-flop 3 included in each ½ divider circuit 11 illustrated in FIG. 3 is supplied to each initial stage multiplexer unit 13*d* as a ½ clock signal. In Lane 0, the output of the "Q" terminal of the D flip-flop 3 is the ½ clock signal X0. In Lane 1, the output of the "Q" terminal of the D flip-flop 3 is the ½ clock signal X1.

Next, the parallel-to-serial conversion circuits 10*a* and 10*b* illustrated in FIG. 3 will be described. Because the parallel-to-serial conversion processes executed in Lanes 0 and 1 are the same, the circuit operation in Lane 0 will be taken as an example in the following description, and the process executed in Lane 1 will be described in accordance with necessity. The parallel-to-serial conversion circuit 10*a* in Lane 0 adjusts the 4-bit parallel data PD0 using the ½ clock signal X0, and the parallel-to-serial conversion circuit 10*b* in Lane 1 adjusts the 4-bit parallel data PD1 using the ½ clock signal X1. The relationship between the ½ clock signals X0 and X1 is as described above.

The parallel-to-serial conversion circuit 10*a* illustrated in FIG. 3 has the initial stage multiplexer unit 13*d*. The initial stage multiplexer unit 13*d* has the two serial output circuits 12. Among the pieces of 4-bit parallel data input to Lane 0, pieces of data PD0[0] and PD0[2] are input to the same serial output circuit 12 included in the initial stage multiplexer unit 13*d*. In addition, among the pieces of 4-bit parallel data input to Lane 0, pieces of data PD0[1] and PD0[3] are input to the same serial output circuit 12 included in the initial stage multiplexer unit 13*d*. The serial output circuit 12 to which the pieces of data PD0[0] and PD0[2] are input outputs a line Y0 of serial data adjusted using the ½ clock signal X0. In addition, the serial output circuit 12 to which the pieces of data PD0[1] and PD0[3] are input outputs a line Y1 of serial data adjusted using the ½ clock signal X0.

In Lane 0, the ½ clock signal X0 is input to the initial stage multiplexer unit 13*d*. Each serial output circuit 12 included in the initial stage multiplexer unit 13*d* has a multiplexer 1 and a D flip-flop 2. In each serial output circuit 12, the ½ clock signal X0 is input to a selector S of the multiplexer 1. In addition, in each serial output circuit 12, the ½ clock signal X0 is also input to a clock signal input terminal of the D flip-flop 2.

In Lane 0, each multiplexer 1 in the initial stage multiplexer unit 13*d* selects either an input signal of a "0" terminal or an input signal of a "1" terminal in accordance with the status of the ½ clock signal X0 input to the selector S, and outputs the selected input signal from a "Z" terminal. The output signal of the "Z" terminal is serial data in which the input signal of the "0" terminal and the input signal of the "1" terminal are alternately arranged in synchronization with the cycle of changes in the status of the ½ clock signal X0. The serial data output from each multiplexer 1 in the initial stage multiplexer unit 13*d* is input to the final stage multiplexer unit 13*e*.

In Lane 0, each D flip-flop 2 in the initial stage multiplexer unit 13*d* holds a signal state input to a "D" terminal thereof and outputs the signal state from a "Q" terminal upon a negative edge, which is falling of the ½ clock signal X0 input to the clock signal input terminal thereof. The output of the "Q" terminal of each D flip-flop 2 does not change until the next falling is input in the cycle of the ½ clock signal X0. Therefore, the output of the "Q" terminal of each D flip-flop 2 synchronizes with the cycle of the ½ clock signal X0. The output of the "Q" terminal of each D flip-flop 2 is input to the "1" terminal of the multiplexer 1 in the corresponding serial output circuit 12.

In FIG. 3, the pieces of data PD0[0] and PD0[1] of the 4-bit parallel data PD0 input to Lane 0 are input to the "0" terminal of each multiplexer 1 in the initial stage multiplexer unit 13*d*. In addition, the pieces of data PD0[2] and PD0[3] are input to the "D" terminal of each D flip-flop 2 in the initial stage multiplexer unit 13*d*. In FIG. 3, the output of the "Q" terminal of the D flip-flop 2 to which the piece of data PD0[2] is input is Q0. The output of the "Q" terminal of the D flip-flop 2 to which the piece of data PD0[3] is input is Q1.

The pieces of data PD0[0], PD0[1], PD0[2], and PD0[3] illustrated in the timing chart of FIG. 4 represent changes in the respective single bits of the 4-bit parallel data input to the parallel-to-serial conversion circuit 10a in Lane 0 over time. In addition, the pieces of data PD1[0], PD1[1], PD1[2], and PD1[3] represent changes in the respective single bits of the 4-bit parallel data input to the parallel-to-serial conversion circuit 10b in Lane 1 over time. As the piece of data PD0[0] in Lane 0, data strings that sequentially change over time from A0[0] to B0[0], and then to C0[0] are input. Similarly, as the piece of data PD0[1], data strings that sequentially change over time from A0[1] to B0[1], and then to C0[1] are input. As the piece of data PD0[2], data strings that sequentially change over time from A0[2] to B0[2], and then to C0[2] are input. As the piece of data PD0[3], data strings that sequentially change over time from A0[3] to B0[3], and then to C0[3] are input. This holds true for the pieces of data PD1[0], PD1[1], PD1[2], and PD1[3]. For example, as the piece of data PD1[0], data strings that sequentially change over time from A1[0] to B1[0], and then to C1[0] are input. The data strings in Lanes 0 and 1 change at the same timing.

In the timing chart of FIG. 4, the pieces of data PD0[0] and PD0[2] are pieces of parallel data input to the serial output circuit 12 included in the initial stage multiplexer unit 13d. The piece of data PD0[0] is input to the "0" terminal of the multiplexer 1 in the serial output circuit 12. The piece of data PD0[2] is input to the "D" terminal of the D flip-flop 2 in the serial output circuit 12. As described above, the piece of data PD0[2] input to the "D" terminal of the D flip-flop 2 is held and output from the "Q" terminal upon falling of the ½ clock signal X0. The output of the "Q" terminal of the D flip-flop 2 to which the piece of data PD0[2] is input is Q0.

In the timing chart of FIG. 4, Q0 represents the data strings A0[2], B0[2], and C0[2] held upon falling of the ½ clock signal X0. Each data string does not change until the next falling is input in the cycle of the ½ clock signal X0. Each data string has a unit interval defined by the cycle of the ½ clock signal X0. The multiplexer 1 in the serial output circuit 12 in Lane 0 to which the pieces of data PD0[0] and PD0[2] are input receives the data strings A0[0], B0[0], and C0[0] of the piece of data PD0[0] and the data strings A0[2], B0[2], and C0[2] of Q0 illustrated in FIG. 4. The multiplexer 1 selects either the signal input to the "0" terminal thereof or the signal input to the "1" terminal thereof in accordance with the status of the ½ clock signal X0 input to the selector S thereof, and outputs the selected input signal from the "Z" terminal thereof. The output of the "Z" terminal of the multiplexer 1 in Lane 0 to which the data strings of the piece of data PD0[0] and the data strings of Q0 are input is Y0.

In the timing chart of FIG. 4, as "Y0", the data strings A0[0], A0[2], B0[0], B0[2], C0[0], and C0[2] are sequentially output in this order in accordance with changes in the status of the ½ clock signal X0. Each data string has a unit interval defined by the status cycle of the ½ clock signal X0. The data strings are synchronized with the status cycle of the ½ clock signal X0. As described above, the data strings output as Y0 are data strings obtained by adjusting the pieces of parallel data PD0[0] and PD0[2] input to the serial output circuit 12 in Lane 0. Thus, the "two-input" parallel data input to each serial output circuit 12 becomes "one-output" serial data adjusted by the status cycle of the clock signal input to the serial output circuit 12. Each piece of data included in the serial data has a unit interval defined by the status cycle of the clock signal and synchronized with each status cycle of the clock signal. It is clear from Y0 illustrated in FIG. 4, the pieces of "two-input" parallel data are sequentially arranged in a line in one cycle of the ½ clock signal X0.

The same conversion process is executed in the serial output circuit 12 in Lane 0 to which the pieces of data PD0[1] and PD0[3] are input. In the timing chart of in FIG. 4, the piece of data PD0[1] is a data string input to a "0" terminal of the multiplexer 1 in the serial output circuit 12. The piece of data PD0[3] is a data string input to a "D" terminal of the D flip-flop 2 in the serial output circuit 12. The data string input to the "D" terminal of the D flip-flop 2 is held and output from a "Q" terminal upon falling of the ½ clock signal X0. The output of the "Q" terminal of the D flip-flop 2 to which the piece of data PD0[3] is input is Q1. Data strings of Q1 include A0[3], B0[3], and C0[3]. The multiplexer 1 in the serial output circuit 12 to which the pieces of data PD0[1] and PD0[3] are input receives the data strings A0[1], B0[1], and C0[1] of the piece of data PD0[1] and the data strings A0[3], B0[3], and C0[3] of Q1 illustrated in FIG. 4. The multiplexer 1 selects either a signal input to the "0" terminal thereof or a signal input to a "1" terminal thereof in accordance with the status of the ½ clock signal input to the selector S thereof, and outputs the selected signal from a "Z" terminal thereof. The output of the "Z" terminal of the multiplexer 1 to which the data strings of the piece of data PD0[1] and the data strings of Q1 are input is Y1.

In the timing chart of FIG. 4, as Y1, the data strings A0[1], A0[3], B0[1], B0[3], C0[1], and C0[3] are sequentially output in this order in accordance with changes in the status of the ½ dock signal X0. Each data string has a unit interval defined by the status cycle of the ½ clock signal X0. The data strings are synchronized with the status cycle of the ½ clock signal X0. As with Y0, the data strings output as Y1 are data strings obtained by adjusting the pieces of parallel data PD0[1] and PD0[3] input to the serial output circuit 12 in Lane 0. Y1 is serial data in which the pieces of "two-input" parallel data are sequentially arranged in a line in one cycle of the ½ clock signal X0.

In FIG. 3, Y0 and Y1, which are the serial data outputs of the initial stage multiplexer unit 13d in Lane 0, are input to the final stage multiplexer unit 13e. The final stage multiplexer unit 13e has the single serial output circuit 12. Y0 and Y1 are input to the serial output circuit 12 in the final stage multiplexer unit 13e parallel to one another.

Y0 is input to a "0" terminal of the multiplexer 1 in the final stage multiplexer unit 13e. Y1 is input to a "D" terminal of the D flip-flop 2 in the final stage multiplexer unit 13e. The clock signal CLK supplied to Lane 0 is input to the final stage multiplexer unit 13e. The clock signal CLK input to the final stage multiplexer unit 13e is input to a selector S of the multiplexer 1, while maintaining the original frequency. In addition, the clock signal CLK input to the final stage multiplexer unit 13e is also input to a clock signal input terminal of the D flip-flop 2, while maintaining the original frequency. The output of a "Q" terminal of the D flip-flop 2 to which Y1 is input is Q2.

As illustrated in the timing chart of FIG. 4, the data strings of Q2 are the data strings of Y1 input to the "D" terminal of the D flip-flop 2 held upon falling of the clock signal CLK. Q2 is synchronized with the cycle of the clock signal CLK. It is clear from the clock signal CLK and the data strings of Y1 illustrated in FIG. 4, the falling of the clock signal CLK occurs at the timing located substantially the center of each data string of Y1. Therefore, the data strings of Q2 are data strings whose signal states are stable.

In FIG. 3, the output of the D flip-flop 2 in the final stage multiplexer unit 13e, namely Q2, is input to a "1" terminal of the multiplexer 1 in the final stage multiplexer unit 13e. The multiplexer 1 in the final stage multiplexer unit 13e adjusts the "two-input" signal in accordance with the status of the clock signal input to the selector S. The "two-input" signal is Y0 and Q2. As a result, the multiplexer 1 in the final stage multiplexer unit 13e generates "one-output" serial data in which the pieces of data are arranged in a line in accordance with the unit intervals of the status cycle of the clock signal CLK. That is, the multiplexer 1 in the final stage multiplexer unit 13e selects Y0 input to the "0" terminal thereof when the status of the clock signal CLK is the "0" state, and Q2 input to the "1" terminal when the status of the clock signal CLK is the "1" state. The serial data adjusted in accordance with the status cycle of the clock signal CLK is output from a "Z" terminal of the multiplexer 1 in the final stage multiplexer unit 13e. The output signal of the multiplexer 1 in the final stage multiplexer unit 13e is the 4-bit serial data SD0, which is the output of Lane 0.

In FIG. 4, the output SD0 of Lane 0 is 4-bit serial data output from the multiplexer 1 in the final stage multiplexer unit 13e. It is clear from the relationships with the clock signal CLK and the data strings of Y0 and Q2 illustrated in FIG. 4, the output SD0 of Lane 0 is data strings obtained by adjusting Y0 and Q2. That is, the output SD0 of Lane 0 is data adjusted by the final stage multiplexer unit 13e. The final stage multiplexer unit 13e has the multiplexer 1. The clock signal CLK is input to the selector S of the multiplexer 1. The clock signal CLK has the original frequency and changes at unit intervals defined by the CLK cycle. The multiplexer 1 adjusts the data strings of Y0, which is the input of the "0" terminal thereof, and the data strings of Q2, which is the input of the "1" terminal thereof, in accordance with the status cycle of the clock signal CLK input to the selector S thereof. Each data string adjusted by the multiplexer 1 has a unit interval defined by the status cycle of the clock signal CLK, and is output as a data string synchronized with the cycle of the clock signal CLK. The multiplexer 1 outputs the adjusted data strings from the "Z" terminal thereof.

In FIG. 4, the data strings A0[0], A0[2], B0[0], B0[2], C0[0], and C0[2] are input to the multiplexer 1 in the final stage multiplexer unit 13e in this order as Y0. Each data string of Y0 has a unit interval defined by the status cycle of the ½ clock signal X0. The data strings of Y0 are synchronized with the cycle of the ½ clock signal X0. In addition, in FIG. 4, the data strings A0[1], A0[3], B0[1], B0[3], C0[1], and C0[3] are input to the multiplexer 1 in the final stage multiplexer unit 13e in this order as Q2. Each data string of Q2 has a unit interval defined by the status cycle of the ½ clock signal X0 and is synchronized with the cycle of the ½ clock signal X0.

In FIG. 4, as the output SD0 of Lane 0, first, the data string A0[0] of Y0 selected when the status of the clock signal CLK is the "0" state is output. Next, the status of the clock signal CLK becomes the "1" state, and the data string A0[1] of Q2 is selected and output. The clock signal CLK having the original frequency periodically changes. Therefore, the status of the clock signal CLK becomes the "0" state again. Accordingly, the data string A0[2] of Y0 is selected and output as the output SD0 of Lane 0. Next, the status of the clock signal CLK becomes the "1" state, the data string A0[3] of Q2 is selected and output as the output SD0 of Lane 0.

The multiplexer 1 in the final stage multiplexer unit 13e continues to execute the selection output operation in accordance with the input status of the clock signal CLK. The unit interval of one status of the clock signal CLK is half the unit interval of one status of the ½ clock signal X0. Therefore, as the output SD0 of Lane 0, pieces of 4-bit parallel data PD0 that have been input at the same timing are output in one cycle of the ½ clock signal X0. For example, when the pieces of 4-bit parallel data A0[0] to A0[3] have been input, the output SD0 of Lane 0 is the data strings (A0[0], A0[1], A0[2], and A0[3]) adjusted in accordance with the unit intervals of the status of the clock signal CLK. The output SD0 of Lane 0 is single-bit serial data in which the input pieces of 4-bit parallel data PD0 are sequentially arranged in a line in a descending bit order, that is, from the highest-order bit PD0[3].

Lane 0 illustrated in FIG. 3 is set as the synchronization signal master for synchronization between the lanes. The ½ divider circuit 11 in Lane 0 outputs the ½ clock signal X0 whose logic value has been inverted by the inverter 4 to Lane 1 through the synchronization signal interface as a synchronization signal output IX0 that serves as a reference of the dividing operation.

FIG. 4 illustrates the relationship between the ½ clock signal X0 in Lane 0 and the synchronization signal output IX0 in Lane 0. It is clear from the relationship between the ½ clock signal X0 and the synchronization signal output IX0 illustrated in FIG. 4, the ½ clock signal X0 and the synchronization signal output IX0 have logic values inverse to each other.

In FIG. 3, Lane 1 is set to the slave state. Therefore, a ½ divider circuit 11 in Lane 1 uses the synchronization signal output from Lane 0 through the synchronization signal interface as a reference of the dividing operation and generates a ½ clock signal. The synchronization signal output IX0 output from Lane 0 is input to a "1" terminal of a multiplexer 1 included in the ½ divider circuit 11 in Lane 1. The status of the master/slave switching signal SEL in Lane 1 is set to "1". Therefore, the ½ divider circuit 11 in Lane 1 selects the synchronization signal IX0 input to the "1" terminal of the multiplexer 1 as a reference signal for the dividing operation.

The selected output of the multiplexer 1 is input to a D flip-flop 3 from a "Z" terminal. The synchronization signal output IX0 selected by the multiplexer 1 in the ½ divider circuit 11 in Lane 1 is input to a "D" terminal of the D flip-flop 3. The D flip-flop 3 in Lane 1 holds the signal state input to the "D" terminal thereof upon rising of the input clock signal CLK. The D flip-flop 3 then outputs the held signal state from a "Q" terminal thereof. The output of the "Q" terminal of the D flip-flop 3 maintains the signal state thereof until the next rising of the clock signal CLK defined by the CLK cycle is input. Therefore, the output of the "Q" terminal of the D flip-flop 3 becomes a ½ clock signal X1 having a cycle twice as long as the unit interval defined by the CLK cycle.

The synchronization signal output IX0 in Lane 0 and the ½ clock signal X1 in Lane 1 illustrated in FIG. 4 have logic values inverse to each other. The ½ clock signal X0 in Lane 0 and the ½ clock signal X1 in Lane 1 change in synchronization with each other.

As described above with regard to Lane 0, the pieces of 4-bit parallel data PD1[0] to PD1[3] input to Lane 1 are adjusted by the ½ clock signal X1. Here, the ½ clock signal X1 in Lane 1 is a signal generated using the synchronization signal output IX0 output from Lane 0 through the synchronization signal interface as a reference of the dividing operation. The 4-bit parallel input data adjusted in an initial stage multiplexer unit 13d in Lane 1 becomes two lines of serial data. Each line of serial data changes at unit intervals defined by the cycle of the ½ clock signal X1 and is synchronized with the cycle of the ½ clock signal X1. Each line of serial data is input to a final stage multiplexer unit 13e. The final stage multiplexer unit 13e has a multiplexer 1. Among the pieces of 4-bit parallel data input to Lane 1, a line in which the pieces of data PD1[0] and PD1[2] are adjusted is input to a "0" terminal of the multiplexer 1.

A line in which the pieces of data PD1[1] and PD1[3] are adjusted is input to a "1" terminal of the multiplexer 1 through a D flip-flop 2 in the final stage multiplexer unit 13e. Furthermore, the clock signal CLK having the original frequency is input to the multiplexer 1 in the final stage multiplexer unit

13*e*. In Lane 1, the clock signal CLK is input to a selector S of the multiplexer 1. The clock signal CLK changes at unit intervals defined by the CLK cycle. The multiplexer 1 adjusts the data strings of the line input of the "0" terminal thereof and the data strings of the line input of the "1" terminal thereof in accordance with the status cycle of the clock signal CLK input to the selector S. Each data string adjusted by the multiplexer 1 has a unit interval defined by the status cycle of the clock signal CLK and is output as a data string synchronized with the cycle of the clock signal CLK. The multiplexer 1 outputs the adjusted data strings from a "Z" terminal thereof. The adjusted data strings become single-bit serial data in which the pieces of 4-bit parallel data PD1 input to Lane 1 are sequentially arranged in a line in a descending bit order, that is, the highest-order bit PD1[3] and PD1[2], PD1[1], and PD1[0] are arranged in this order. The serial data is the output SD1 of Lane 1.

In FIG. 4, the output SD1 of Lane 1 is output while the data strings PD1[3], PD1[2], PD1[1], and PD1[0] are sequentially arranged in a line in this order. In the case of the data string A1[3], A1[2], A1[1], and A1[0] are sequentially output in this order. The output SD0 of Lane 0 and the output SD1 of Lane 1 have bit values that change at a synchronized timing. The unit interval of each bit value is a unit interval defined by the status cycle of the clock signal CLK having the original frequency. That is, the pieces of 4-bit serial data, which is the data outputs of the lanes, are synchronized with one another.

As described above, Lane 1, which is set to the slave state, selects the synchronization signal input through the synchronization signal interface as a reference of the dividing operation. Therefore, synchronization between adjacent lanes may be assured. A lane that has been set to the slave state uses a synchronization signal input through a synchronization signal interface as a reference of the dividing operation to generate divided clock signals. Therefore, the generated divided clock signals are synchronized with those in an adjacent lane. Single-bit data strings adjusted after the synchronization between the lanes is assured become serial data whose bit values change at a synchronized timing, thereby realizing synchronized output between the lanes.

In the first embodiment, the parallel-to-serial conversion circuit 10 in each lane has a ½ divider circuit 11 and a plurality of "two-input, one-output" serial output circuits 12 that convert parallel inputs into serial outputs, namely, for example, three serial output circuits 12. In each lane, each serial output circuit 12 is operated by a clock signal obtained by dividing in half a clock signal that causes an adjacent serial output circuit 12 on the output side to operate. As illustrated in FIG. 3, the ½ divider circuit 11 includes a D flip-flop 3 and an inverter 4. The synchronization between the lanes is realized by one of the plurality of lanes by inputting the output of the inverter 4 to a D flip-flop 3 in the adjacent lane. Therefore, the synchronization between the lanes may be realized with a considerably simple configuration.

As illustrated in FIGS. 3 and 4, in this embodiment, the reset signals that are the same between all the lanes are not used. Therefore, because a distribution circuit having a complex function of adjusting the timing for distribution of the reset signals is not included, the circuits may be easily realized.

Modification

Figure 5:
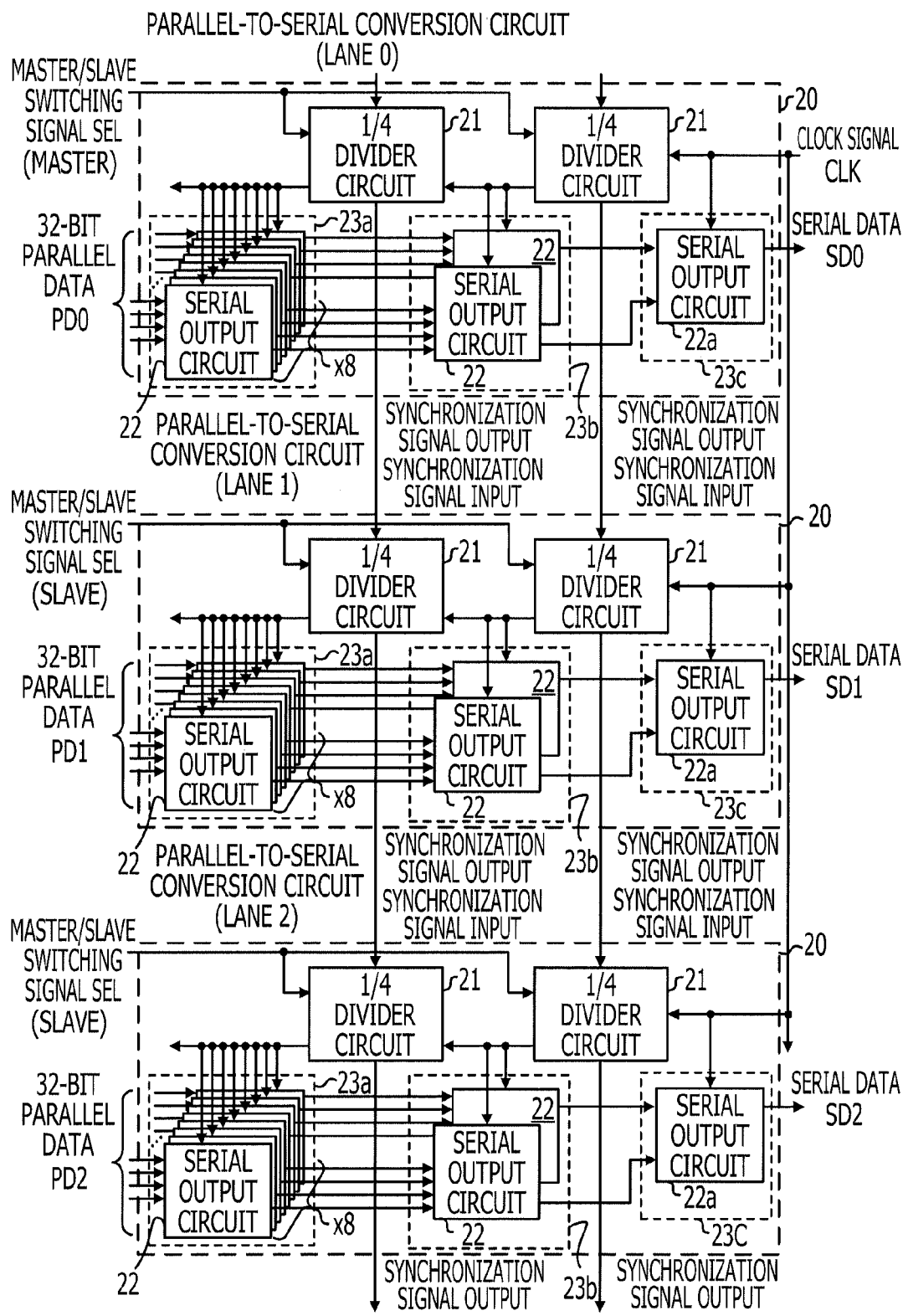
FIG. 5 is a diagram illustrating a modification of the parallel-to-serial conversion circuits according to the first embodiment.

As a modification of the parallel-to-serial conversion circuit 10 according to the first embodiment, for example, a mode illustrated in FIG. 5 may be used. FIG. 5 illustrates parallel-to-serial conversion circuits 20 that convert 32-bit parallel data into a single-bit data string and output the single-bit data string. In FIG. 5, the parallel-to-serial conversion circuits 20 that convert pieces of 32-bit parallel data PD0 to PD2 into single-bit data strings and output the single-bit data strings are provided for three lanes. The same clock signals CLK that change in a certain cycle is input to the lanes. Pieces of serial data SD0 to SD2, which are the outputs of the lanes, are synchronized with the clock signal CLK and output.

The parallel-to-serial conversion circuits 20 illustrated in FIG. 5 each have an initial stage multiplexer unit 23*a*. The initial stage multiplexer unit 23*a* has eight serial output circuits 22. Each serial output circuit 22 has a "four-input, one-output" multiplexer (MUX). Each serial output circuit 22 in the initial stage multiplexer unit 23*a* adjusts "four-input" parallel data using a certain divided clock signal (in FIG. 5, a ¹⁄₁₆ clock signal). As a result, each serial output circuit 22 in the initial stage multiplexer unit 23*a* outputs serial data of a 4-bit string having a unit interval defined by the status cycle of the ¹⁄₁₆ clock signal. Eight lines of serial data output from the initial stage multiplexer unit 23*a* are input to an intermediate stage multiplexer unit 23*b* having two serial output circuits 22. Each serial output circuit 22 has a "four-input, one-output" multiplexer (MUX).

The intermediate stage multiplexer unit 23*b* further adjusts the eight lines of input 4-bit serial data using a certain divided clock signal (in FIG. 5, a ¼ clock signal). As a result, each serial output circuit 22 in the intermediate stage multiplexer unit 23*b* outputs serial data of a 16-bit string having a unit interval defined by the status cycle of the ¼ clock signal. Two lines of 16-bit serial data adjusted in the intermediate stage multiplexer unit 23*b* are input to a final stage multiplexer unit 23*c*. The final stage multiplexer unit 23*c* has a "two-input, one-output" multiplexer (MUX). The final stage multiplexer unit 23*c* has a single serial output circuit 22*a*. The serial output circuit 22*a* in the final stage multiplexer unit 23*c* adjusts the two lines of input 16-bit serial data using the clock signal CLK and arranges the two lines of 16-bit serial data as a 32-bit string.

The bit string has a unit interval defined by the status cycle of the clock signal CLK having the original frequency. The output of the final stage multiplexer unit 23*c* is 32-bit serial data of a single-bit string in which the pieces of 32-bit parallel data input to the corresponding lane are sequentially arranged in a line in a descending bit order in accordance with the status cycle of the clock signal CLK. The 32-bit serial data is data in which pieces of 32-bit parallel data PD0[0] to PD0[31] input to the corresponding parallel-to-serial conversion circuit 20 are sequentially arranged in a line in a descending bit order.

In the first embodiment, the ½ divider circuit 11 that outputs the synchronization signal to an adjacent lane through the synchronization signal interface is included in order to synchronize the lanes. In the modification, too, two ¼ divider circuits 21 each having a synchronization signal interface are included and output synchronization signals that serve as references of the dividing operations.

That is, as with the first embodiment, a lane that has been set to the master state generates a synchronization signal that serves as a reference of the dividing operation, as well as outputting the synchronization signal generated thereby to an adjacent lane through the synchronization signal interface. In each parallel-to-serial conversion circuit 20 according to the modification, a divided clock signal generated using the synchronization signal output through the synchronization signal interface is a ¼ clock signal. Each parallel-to-serial conversion circuit 20 according to the modification further divides the ¼ clock signal with the two ¼ divider circuits 21, namely a first ¼ divider circuit 21 and a second ¼ divider circuit 21, in order to generate a ¹⁄₁₆ clock signal. Each parallel-to-serial conversion circuit 20 illustrated in FIG. 5 has the initial stage multiplexer unit 23a to which the 1/16 clock signal is input. Each parallel-to-serial conversion circuit 20 also has the intermediate stage multiplexer unit 23b to which the 1/4 clock signal is input.

Each of the eight lines of serial data in the initial stage multiplexer unit 23a is 4-bit serial data in which a single-bit string having a unit interval defined by the status cycle of a 1/16 clock signal is arranged in a line. Each of the two lines of serial data in the intermediate stage multiplexer unit 23b is 16-bit serial data in which a single-bit string having a unit interval defined by the status cycle of a 1/4 clock signal is arranged in a line. The final stage multiplexer unit 23c to which the clock signal CLK having the original frequency is input adjusts the two lines of 16-bit serial data in accordance with the status cycle of the clock signal CLK and outputs serial data in which the 32-bit parallel data is converted into a single-bit data string.

In the modification, too, as with the first embodiment, master/slave switching signals SEL0 to SEL2 are input to the lanes, respectively. Therefore, as with the first embodiment, Lane 0 is set to the master state, and synchronization signals that serve as references of the dividing operations are generated and output to Lanes 1 and 2, which have been set to the slave state. As a result, the same synchronization effect as the first embodiment may be obtained between the lanes. That is, in the modification, too, it is possible to arrange the serial data outputs of a lane that has been selected as a master and an adjacent lane that has been selected as a slave within 1 UI and synchronize the serial data outputs. In addition, in the modification, by providing the serial output circuits 22 each having a "four-input one-output" multiplexer (MUX), a process for converting 32-bit parallel data into 32-bit serial data in which the 32-bit parallel data is arranged in a single-bit string may be executed. Therefore, because synchronization may be automatically established between the lanes even if the amount of data to be processed increases, it is possible to realize the parallel-to-serial conversion circuits 20 that are suitable for transmission of a large amount of data.

In the modification, the clock signal CLK is an example of a "clock signal having a second clock cycle", and the 1/4 clock signal obtained as a result of division executed by the 1/4 divider circuit 21 is an example of a "clock signal having a first clock cycle". In addition, in the modification, the serial output circuit 22a included in the final stage multiplexer unit 23c to which the clock signal CLK is input is an example of a "serial output circuit". In addition, in the modification, the serial output circuit 22 to which a signal divided by the 1/4 divider circuit 21 is input is an example of a "parallel input circuit".

Second Embodiment

Figure 6:
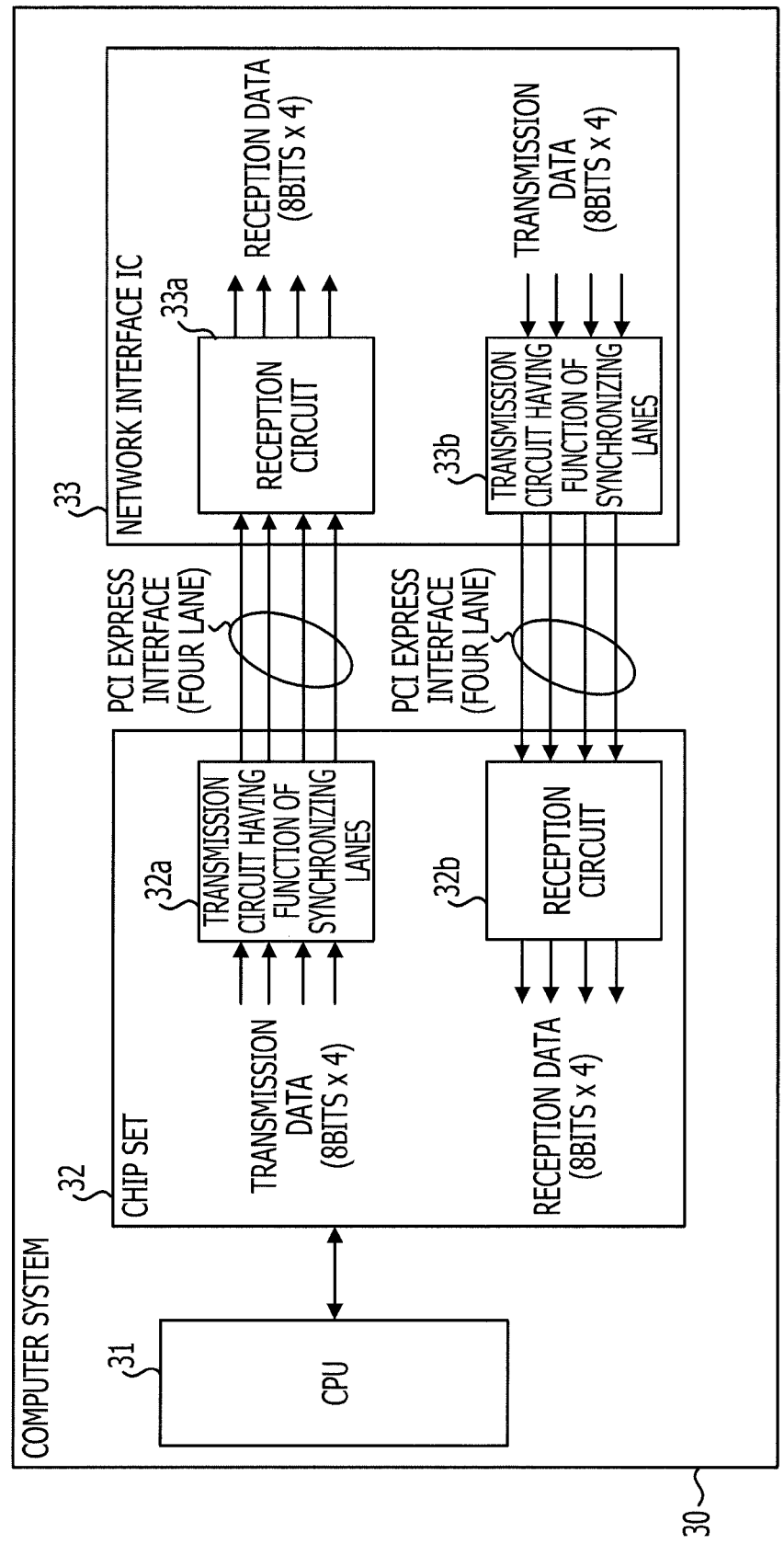
FIG. 6 is a diagram illustrating a second embodiment.
Figure 7:
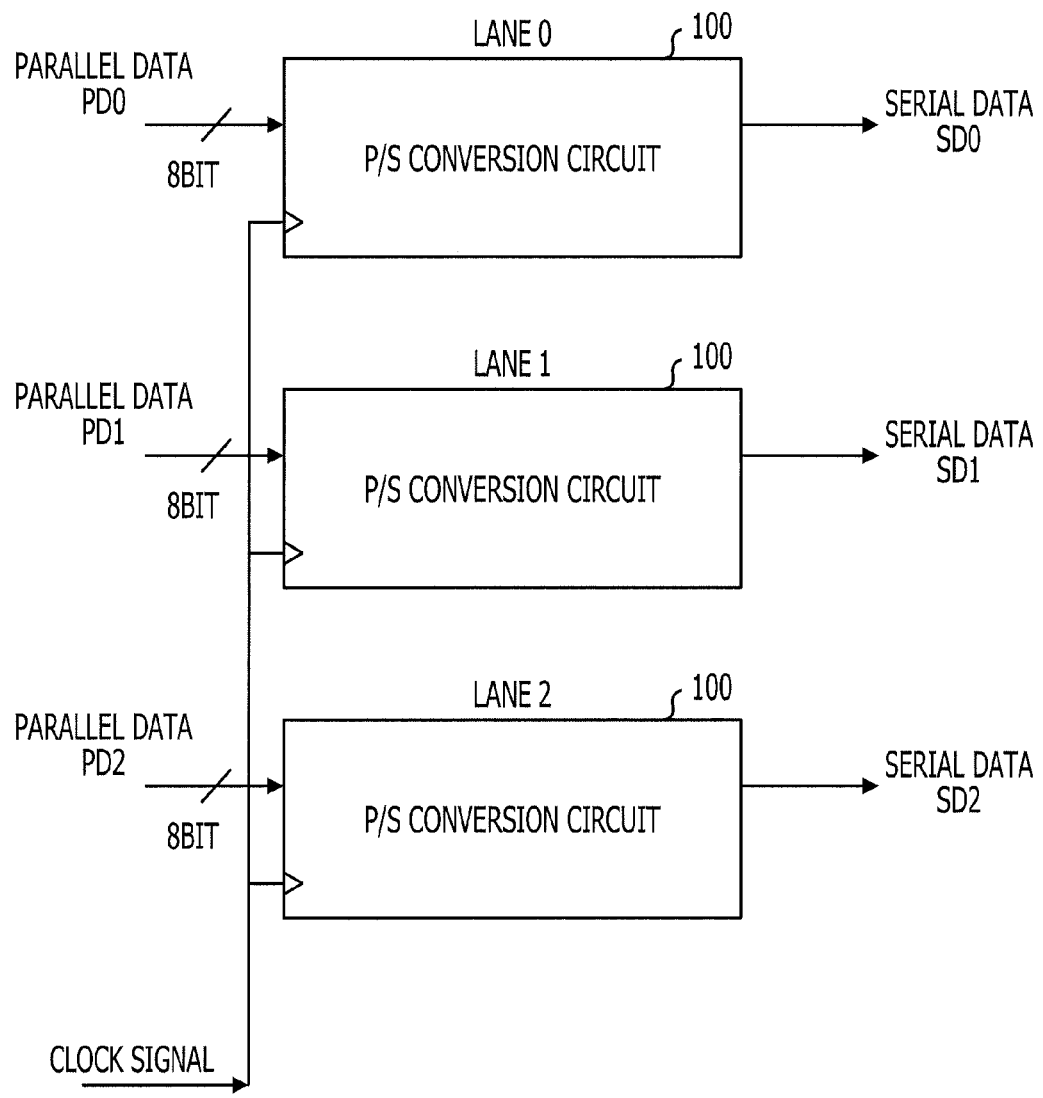
FIG. 7 is a schematic block diagram illustrating parallel-to-serial conversion circuits provided for a plurality of lanes.
Figure 8:
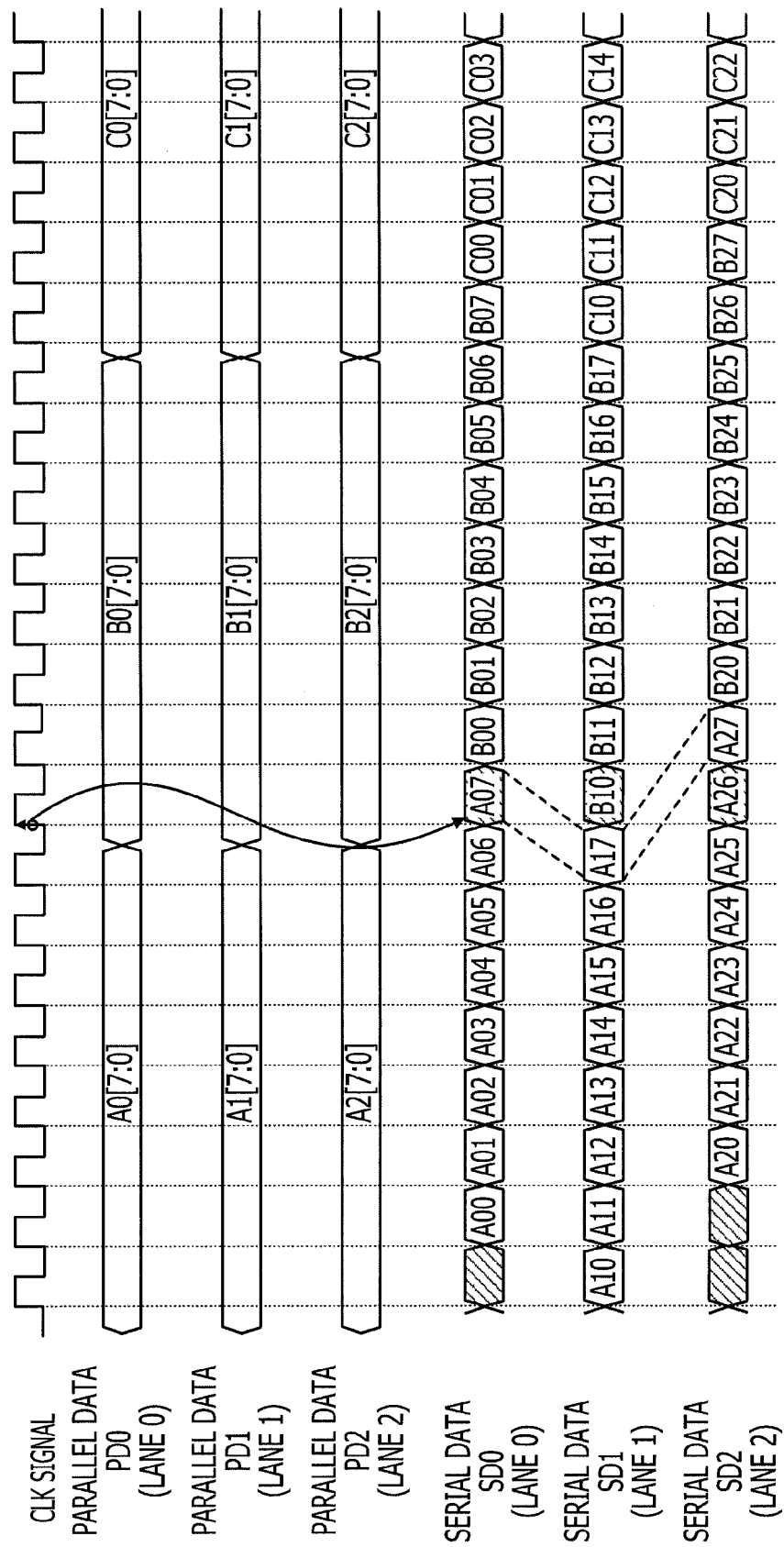
FIG. 8 is a timing chart illustrating data skew that occurs between the lanes.

FIG. 6 illustrates a second embodiment. The second embodiment illustrated in FIG. 6 is an information processing apparatus 30 having the parallel-to-serial conversion circuits 10 described in the first embodiment in four lanes. The information processing apparatus 30 has a central processing unit (CPU) 31, a chip set 32, and a network interface integrated circuit (IC) 33. The CPU 31 is a CPU that executes various types of arithmetic processing and is a system large scale integrated circuit (LSI) including a read-only memory (ROM) that stores a program in which the procedure of a process to be executed by the CPU is written and the like, and a random-access memory (RAM) that serves as a work area. The CPU 31 executes various programs and provides the function of the information processing apparatus 30. As the information processing apparatus 30, for example, a personal computer (PC) or a computer system such as a server may be used.

The chip set 32 has a transmission circuit 32a having a function of synchronizing the lanes that converts four lines of 8-bit transmission data that have been input parallel to one another into four lines of serial data and outputs the four lines of serial data. A serial-to-parallel conversion circuit for one line corresponds to a lane. The chip set 32 also has a reception circuit 32b that receives the four lines of serial data and demodulates the four lines of serial data as four lines of 8-bit parallel reception data. The four lines of 8-bit transmission data input parallel to one another in the chip set 32 are output from the CPU 31 through an interface. As illustrated in FIG. 6, the four lines of serial data are output to the network interface IC 33 through PCI Express Interfaces. Furthermore, as illustrated in FIG. 6, the chip set 32 receives four lines of serial data transmitted from the network interface IC 33 through PCI Express interfaces. The four lines of received serial data are demodulated as four lines of 8-bit parallel reception data and output to the CPU 31 through the interface.

The transmission circuit 32a having a function of synchronizing the lanes has the parallel-to-serial conversion circuits 10 according to the first embodiment for the four lines and adjusts the pieces of 8-bit transmission data input parallel to one another using a certain clock signal. The adjusted transmission data becomes 8-bit serial data of a single-bit string in which the pieces of 8-bit parallel data are sequentially arranged in a line in a descending bit order and is output.

The network interface IC 33 is, for example, an interface IC that executes communication control of various pieces of data processed in the information processing apparatus 30. The network interface IC 33 has a reception circuit 33a that receives four lines of serial data output from the chip set 32 and demodulates the four lines of serial data as four lines of 8-bit parallel reception data. The network interface IC 33 also has a transmission circuit 33b having a function of synchronizing the lanes that converts the four lines of 8-bit transmission data input parallel to one another into four lines of serial data and outputs the four lines of serial data.

The network interface IC 33 outputs the four lines of 8-bit parallel reception data demodulated by the reception circuit 33a to, for example, a storage apparatus or the like connected thereto by a certain bus. The network interface IC 33 converts, for example, four lines of 8-bit parallel data transmitted from a communication unit or the like connected thereto by a certain bus into four lines of serial data with the transmission circuit 33b having a function of synchronizing the lanes. As illustrated in FIG. 6, the four lines of converted serial data are, for example, output to the chip set 32 through the PCI Express interfaces.

The transmission circuit 33b having a function of synchronizing the lanes included in the network interface IC 33 has the parallel-to-serial conversion circuit 10 according to the first embodiment for the four lines and adjusts the pieces of 8-bit transmission data input parallel to one another using a certain clock signal. As a result, 8-bit serial data of a single-bit string in which the pieces of 8-bit parallel data are sequentially arranged in a line in a descending bit order is output. The transmission circuit 32a having a function of synchronizing the lanes included in the chip set 32 and the transmission circuit 33b having a function of synchronizing the lanes included in the network interface IC 33 may have the same configuration if the peripheral interfaces match.

As described above, in this embodiment, for example, data transfer between the CPU 31 and the network interface IC 33 is realized by the chip set 32 having the parallel-to-serial conversion circuits 10 according to the first embodiment. As a result, the information processing apparatus 30 in which data skew does not occur between a plurality of lanes may be realized. In this embodiment, data to be input is not limited to the 8-bit parallel input. In addition, the number of lanes to be synchronized with one another in this embodiment is not limited to 4.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A parallel-to-serial conversion circuit comprising a plurality of parallel-to-serial conversion units, each being configured to include
    a dividing circuit configured to divide a clock signal having a second clock cycle to generate a clock signal having a first clock cycle,
    a parallel input circuit configured to input a signal having a plurality of bits parallel to one another in the first clock cycle, and
    a serial output circuit configured to serially output the signal having the plurality of bits input to the parallel input circuit bit-by-bit in the second clock cycle,
    wherein, among the plurality of parallel-to-serial conversion units, one of the dividing circuits has a synchronization signal interface that causes an output clock signal to synchronize with a clock signal output from the other dividing circuit in another parallel-to-serial conversion unit.

2. The parallel-to-serial conversion circuit according to claim 1,
    wherein a first dividing circuit in a first parallel-to-serial conversion unit includes
    a first flip-flop configured to output an input signal of an input terminal to an output terminal using the clock signal having the second clock cycle, and
    a first inverter configured to input an inverted signal obtained by inverting a signal from the output terminal of the first flip-flop to the input terminal,
    wherein the first dividing circuit transmits the inverted signal to an adjacent parallel-to-serial conversion unit connected through the synchronization signal interface, and
    wherein a second dividing circuit of a second parallel-to-serial conversion unit includes
    a second flip-flop configured to output the inverted signal transmitted from the first parallel-to-serial conversion unit through the synchronization signal interface to an output terminal using the clock signal having the second clock cycle.

3. The parallel-to-serial conversion circuit according to claim 2,
    wherein the second parallel-to-serial conversion circuit includes a second inverter configured to output an inverted signal obtained by inverting the signal from the output terminal of the second flip-flop to the synchronization signal interface and transmits the inverted signal to the adjacent parallel-to-serial conversion unit connected through the synchronization signal interface.

4. An information processing apparatus comprising:
    an information processing unit; and
    a plurality of parallel-to-serial conversion circuits connected to the information processing unit,
    wherein each of the plurality of parallel-to-serial conversion circuits includes
    a plurality of parallel-to-serial conversion units, each being configured to include
    a dividing circuit configured to divide a clock signal having a second clock cycle to generate a clock signal having a first clock cycle,
    a parallel input circuit configured to input a signal having a plurality of bits parallel to one another in the first clock cycle, and
    a serial output circuit configured to serially output the signal having the plurality of bits input to the parallel input circuit bit-by-bit in the second clock cycle,
    wherein, among the plurality of parallel-to-serial conversion units, one of the dividing circuits has a synchronization signal interface that causes an output clock signal to synchronize with a clock signal output from the other dividing circuit in another parallel-to-serial conversion unit.

5. An information processing system comprising:
    a plurality of information processing units; and
    a parallel-to-serial conversion circuit configured to connect the plurality of information processing units with one another,
    wherein the parallel-to-serial conversion circuit includes
    a plurality of parallel-to-serial conversion units, each being configured to include
    a dividing circuit configured to divide a clock signal having a second clock cycle to generate a clock signal having a first clock cycle,
    a parallel input circuit configured to input a signal having a plurality of bits parallel to one another in the first clock cycle, and
    a serial output circuit configured to serially output the signal having the plurality of bits input to the parallel input circuit bit-by-bit in the second clock cycle,
    wherein, among the plurality of parallel-to-serial conversion units, one of the dividing circuits has a synchronization signal interface that causes an output clock signal to synchronize with a clock signal output from the other dividing circuit in another parallel-to-serial conversion unit.

6. A parallel-to-serial conversion method comprising performing at least two parallel-to-serial conversion processes in parallel, each including:
    dividing a clock signal having a second clock cycle to generate a clock signal having a first clock cycle;
    inputting a signal having a plurality of bits parallel to one another in the first clock cycle;
    outputting the input signal having the plurality of bits bit-by-bit in the second clock cycle, as a serial signal;
    generating a synchronization signal for each of the at least two parallel-to-serial conversion processes; and
    determining whether or not to execute the dividing based on the synchronization signal.

* * * * *